(12) United States Patent
Suzuki et al.

(10) Patent No.: US 10,347,715 B2
(45) Date of Patent: Jul. 9, 2019

(54) SEMICONDUCTOR DEVICE HAVING IMPROVED SAFE OPERATING AREAS AND MANUFACTURING METHOD THEREFOR

(71) Applicant: Mitsubishi Electric Corporation, Tokyo (JP)

(72) Inventors: Kenji Suzuki, Tokyo (JP); Tetsuo Takahashi, Tokyo (JP); Mitsuru Kaneda, Tokyo (JP); Ryu Kamibaba, Tokyo (JP); Koichi Nishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/648,062

(22) Filed: Jul. 12, 2017

(65) Prior Publication Data
US 2018/0130875 A1   May 10, 2018

(30) Foreign Application Priority Data
Nov. 10, 2016   (JP) ................................ 2016-219845

(51) Int. Cl.
| H01L 29/06 | (2006.01) |
| H01L 29/10 | (2006.01) |
| H01L 21/04 | (2006.01) |
| H01L 29/08 | (2006.01) |
| H01L 29/66 | (2006.01) |

(Continued)

(52) U.S. Cl.
CPC ........ *H01L 29/0638* (2013.01); *H01L 21/047* (2013.01); *H01L 21/26586* (2013.01); *H01L 29/0623* (2013.01); *H01L 29/0696* (2013.01); *H01L 29/0834* (2013.01); *H01L 29/1095* (2013.01); *H01L 29/66068* (2013.01); *H01L 29/7397* (2013.01); *H01L 21/26506* (2013.01); *H01L 21/26513* (2013.01)

(58) Field of Classification Search
CPC ............ H01L 29/0696; H01L 29/1095; H01L 29/66325; H01L 29/7395; H01L 29/7397
See application file for complete search history.

(56) References Cited

U.S. PATENT DOCUMENTS

| 6,188,109 B1 * | 2/2001 | Takahashi | ............... H01L 22/34 257/153 |
| 2008/0054369 A1 * | 3/2008 | Schulze | ............... H01L 29/0834 257/378 |

(Continued)

FOREIGN PATENT DOCUMENTS

| JP | 2009-176882 A | 8/2009 |
| JP | 2011-119542 A | 6/2011 |

(Continued)

*Primary Examiner* — Phat X Cao
(74) *Attorney, Agent, or Firm* — Studebaker & Brackett PC

(57) ABSTRACT

A semiconductor device includes a drift layer formed of a first conductive type semiconductor material, a MOSFET part including a p-type base layer provided on a front surface of the drift layer, a first n-type buffer layer provided on a reverse side of the drift layer, and a second n-type buffer layer provided on a reverse side of the first n-type buffer layer and having a high impurity concentration. The first n-type buffer layer has a higher impurity concentration than the drift layer and has a total amount of electrically active impurities per unit area of $1.0 \times 10^{12}$ cm$^{-2}$ or less.

9 Claims, 18 Drawing Sheets

(51) Int. Cl.
   *H01L 29/739*   (2006.01)
   *H01L 21/265*   (2006.01)

(56) References Cited

U.S. PATENT DOCUMENTS

| | | |
|---|---|---|
| 2009/0184338 A1 | 7/2009 | Hisamoto |
| 2011/0133246 A1 | 6/2011 | Ueno |
| 2012/0049902 A1* | 3/2012 | Corona ............ H01L 21/02381 327/109 |
| 2016/0260703 A1* | 9/2016 | Nakamura ............ H01L 29/404 |

FOREIGN PATENT DOCUMENTS

| | | |
|---|---|---|
| JP | 2014-039057 A | 2/2014 |
| WO | 2016/147264 A1 | 9/2016 |

\* cited by examiner

POLISHING

SEMICONDUCTOR DEVICE HAVING IMPROVED SAFE OPERATING AREAS AND MANUFACTURING METHOD THEREFOR

FIELD

The present invention relates to a semiconductor device.

BACKGROUND

Conventionally, for example, as disclosed in JP 2011-119542 A, an IGBT is known which is provided with two buffer layers having different impurity concentrations on a drift layer reverse side. The IGBT according to this publication is provided with a low impurity concentration buffer layer located away from a $p^+$ collector layer of the IGBT and a high impurity concentration buffer layer located near the $p^+$ collector layer.

It is one of features of the technique relating to this publication that a total thickness and a total impurity amount of the low impurity concentration buffer layer and the high impurity concentration buffer layer are confined within a certain range. Paragraph 0022 of the publication describes a specific structure of a buffer layer 24 which is the low impurity concentration buffer layer, having an impurity concentration of $2 \times 10^{16}$ cm$^{-3}$, a thickness of 40 μm and a total impurity amount of $8 \times 10^{13}$ cm$^{-2}$.

The low impurity concentration buffer layer located away from the $p^+$ collector layer according to the above prior art will also be called hereinafter a "deep low concentration buffer layer" in the sense that it is a buffer layer formed deep in the drift layer and having a relatively low impurity concentration. Meanwhile, the high impurity concentration buffer layer located near the $p^+$ collector layer according to the above prior art will also be called hereinafter a "shallow high concentration buffer layer" in the sense that it is a buffer layer formed shallow in the drift layer and having a relatively high impurity concentration.

When no shallow high concentration buffer layer is provided, the lower the impurity concentration of the deep low concentration buffer layer, the significantly greater a leakage current of the IGBT becomes. When a shallow high concentration buffer layer is provided, there is an advantage that the leakage current is reduced to a sufficiently small level even when the impurity concentration of the deep low concentration buffer layer is low.

On the other hand, when the impurity concentration of the deep low concentration buffer layer is too high, there is a disadvantage that an electric field on the drift layer reverse side in a safe operation region becomes too high in the event of short circuit current interruption. The safe operation region at the time of short circuit current interruption is one of capabilities of a switching element and is also called "SCSOA (short circuit safe operating area)." Although an impurity concentration of the deep low concentration buffer layer needs to be designed so as to fall within an adequate range, JP 2011-119542 A above has merely disclosed a concentration which is high to a certain degree, and has not given sufficient consideration to SCSOA.

JP 2011-119542 A above does not provide specific description of dopants of the shallow high concentration buffer layer and the deep low concentration buffer layer and a manufacturing method therefor. As a result of intensive research, the inventor of the present invention came to find a preferable method for manufacturing a semiconductor device provided with a shallow high concentration buffer layer and a deep low concentration buffer layer.

One of capabilities of a switching element is a reverse bias safe operation area (RBSOA). As a result of intensive research, the inventor of the present invention came to find a preferable structure that satisfies a good RBSOA.

SUMMARY

The present invention has been implemented to solve the aforementioned problems and it is an object of the present invention to provide a semiconductor device with improved SCSOA and a manufacturing method therefor.

It is another object of the present invention to provide a preferable manufacturing method for manufacturing a semiconductor device provided with a shallow high concentration buffer layer and a deep low concentration buffer layer.

It is further another object of the present invention to provide a semiconductor device with an improved RBSOA.

A semiconductor device according to a first aspect of the present invention includes: a drift layer formed of a first conductive type semiconductor material; a MOSFET part provided on a front surface of the drift layer and comprising a second conductive type semiconductor layer that forms a pn junction with the drift layer; a first buffer layer; and a second buffer layer. The first buffer layer is provided on a reverse side of the drift layer. The first buffer layer has the first conductive type, and has a higher impurity concentration than the drift layer. The first buffer layer has a total amount of electrically active impurities per unit area of $1.0 \times 10^{12}$ cm$^{-2}$ or less. The second buffer layer is provided on a reverse side of the first buffer layer. The second buffer layer has the first conductive type, and has a higher impurity concentration than the first buffer layer.

A method for manufacturing a semiconductor device according to a second aspect of the present invention includes: a step of preparing a drift layer comprising a MOSFET part on a surface thereof; a first buffer layer formation step of forming a first buffer layer by ion-implanting protons to a first depth into a reverse side of the drift layer; and a second buffer layer formation step of forming a second buffer layer by ion-implanting group V elements to a second depth shallower than the first depth into a reverse side of the first buffer layer. The first buffer layer has an impurity concentration distribution in a thickness direction with a first concentration peak. The second buffer layer has an impurity concentration distribution in the thickness direction with a second concentration peak higher than the first concentration peak.

A semiconductor device according to a third aspect of the present invention includes: a drift layer formed of a first conductive type semiconductor material; a cell part provided on a front surface of the drift layer; a peripheral portion provided around the cell part on the front surface of the drift layer; a buffer layer that is provided on a reverse side of the drift layer and has the first conductive type; and a collector layer. The collector layer is provided so as to extend over a region directly below the cell part and a region directly below the peripheral portion on a reverse side of the buffer layer, and has a second conductive type, whose impurity concentration in a region directly below the peripheral portion is lower than an impurity concentration in a region directly below the cell part.

Other and further objects, features and advantages of the invention will appear more fully from the following description.

DESCRIPTION OF EMBODIMENTS

First Embodiment.

Figure 1:
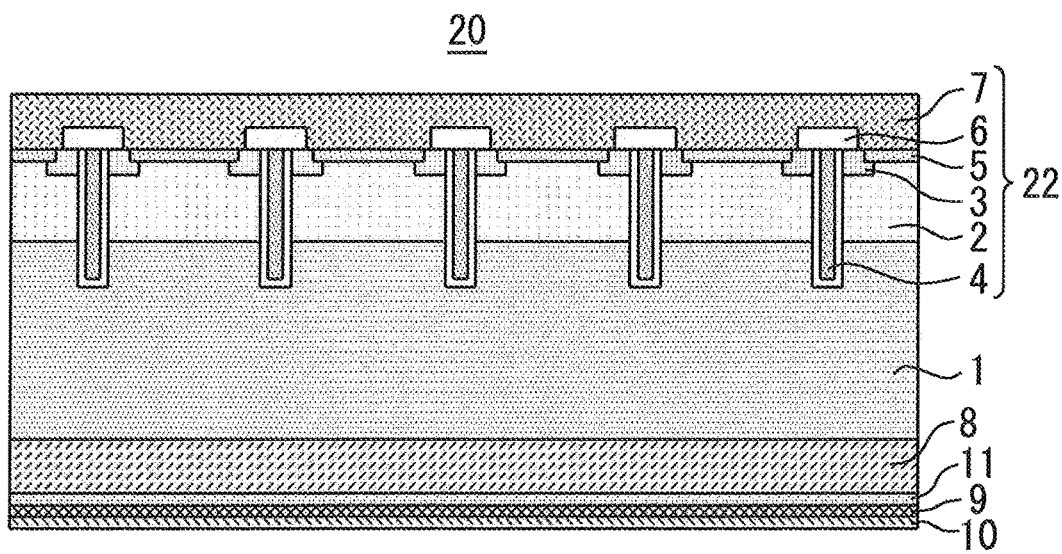
FIG. 1 is a diagram illustrating a semiconductor device according to a first embodiment of the present invention.

FIG. 1 is a diagram illustrating a semiconductor device 20 according to a first embodiment of the present invention. The semiconductor device 20 according to the first embodiment is an insulated gate bipolar transistor (IGBT) provided with a trench gate. In FIG. 1, the semiconductor device 20 is provided with a substrate 1. The substrate 1 is made of silicon and has n-type conductivity. Since the substrate 1 functions as a drift layer 1 in the IGBT, the substrate 1 hereinafter will also be referred to as a "drift layer 1."

A MOSFET part 22 is provided on the drift layer 1 using a surface process. The MOSFET part 22 is provided with a p-type base layer 2, $n^+$-type emitter layers 3, trench gates 4, a $p^+$-type layer 5, an interlayer insulating films 6 and an emitter electrode 7. The p-type base layer 2 is provided on a front surface of the drift layer 1. The p-type base layer 2 is joined to the drift layer 1 to form a pn junction, creating a depletion layer. A plurality of $n^+$-type emitter layers 3 are discretely formed at a plurality of locations on a front surface of the p-type base layer 2. The trench gates 4 are provided so as to penetrate their respective $n^+$-type emitter layers 3. The $p^+$-type layer 5 is provided between the plurality of $n^+$-type emitter layers 3 on the front surface of the p-type base layer 2. The interlayer insulating films 6 cover the surface sides of the $n^+$-type emitter layers 3 and the trench gates 4. The emitter electrode 7 covers surfaces of the interlayer insulating films 6 and the $p^+$-type layer 5.

A first n-type buffer layer 8 and a second n-type buffer layer 11 are provided on the reverse side of the drift layer 1. The first n-type buffer layer 8 has a low impurity concentration and is an n-type buffer layer formed up to a deep region of the drift layer 1. The first n-type buffer layer 8 is manufactured by implanting protons into the reverse side of the drift layer 1 using an ion implanter. More specifically, the first n-type buffer layer 8 is formed by implanting protons a plurality of times while changing an acceleration voltage up to, for example, a maximum of 1500 keV using a proton implanter. In the first embodiment, suppose that the first n-type buffer layer 8 is formed up to a depth on the order of 30 μm from the reverse side of the drift layer 1 before ion implantation.

The second n-type buffer layer 11 is a layer formed in a shallow region on the reverse side of the drift layer 1 and has a higher impurity concentration than the first n-type buffer layer 8. The second n-type buffer layer 11 is formed by ion-implanting phosphor or arsenic into the drift layer 1 reverse side after forming the first n-type buffer layer 8 and activating it through heat treatment.

A p-type collector layer 9 is provided on a reverse side of the second n-type buffer layer 11. In addition, a collector electrode 10 is provided on a reverse side of the collector layer 9.

Figure 2:
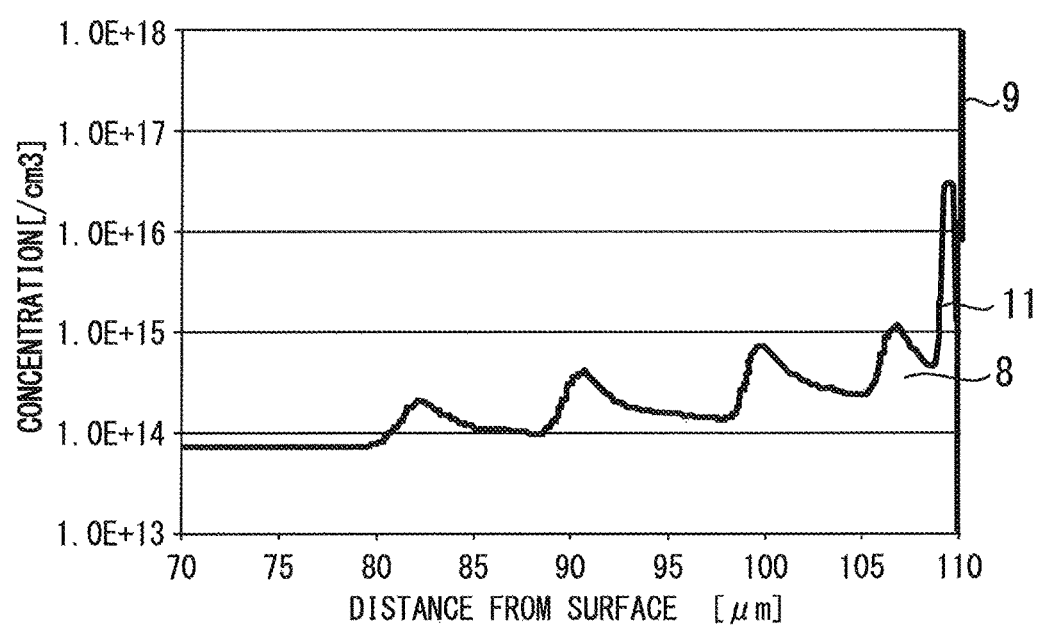
FIG. 2 is a graph illustrating an impurity concentration distribution of the semiconductor device according to the first embodiment of the present invention.

FIG. 2 is a graph illustrating an impurity concentration distribution of the semiconductor device 20 according to the first embodiment of the present invention. FIG. 2 shows an impurity concentration profile on the reverse side of the drift layer 1 of the semiconductor device 20. The collector layer 9 located closest to the reverse side has a highest impurity concentration. The second n-type buffer layer 11 closer to the drift layer 1 than the collector layer 9 has an impurity concentration peak of approximately $4\times10^{16}$ cm$^{-3}$. The first n-type buffer layer 8 closer to the drift layer 1 than the second n-type buffer layer 11 has a plurality of concentration peaks, or more specifically four concentration peaks. Of the four concentration peaks of the first n-type buffer layer 8, the concentration peak closest to the second n-type buffer layer 11 is approximately $1.0\times10^{15}$ cm$^{-3}$. The remaining three concentration peaks gradually descend as the distance from the second n-type buffer layer 11 increases.

Note that thicknesses of the first n-type buffer layer 8 and the second n-type buffer layer 11 will be illustrated respectively. As an example, as will be set using a simulation shown in FIG. 10 and FIG. 11 which will be described later, a proton implantation depth when forming the first n-type buffer layer 8 may be on the order of 30 µm and a thickness of the second n-type buffer layer 11 may be on the order of approximately 1 µm to several µm. The thickness of the first n-type buffer layer 8 has a value obtained by subtracting the total thickness of the second n-type buffer layer 11 and the collector layer 9 from 30 µm which is the proton implantation depth.

Hereinafter, operations and effects of the semiconductor device 20 according to the first embodiment will be described. FIG. 3 to FIG. 11 are graphs for describing operations and effects of the semiconductor device 20 according to the first embodiment of the present invention.

Figure 23:
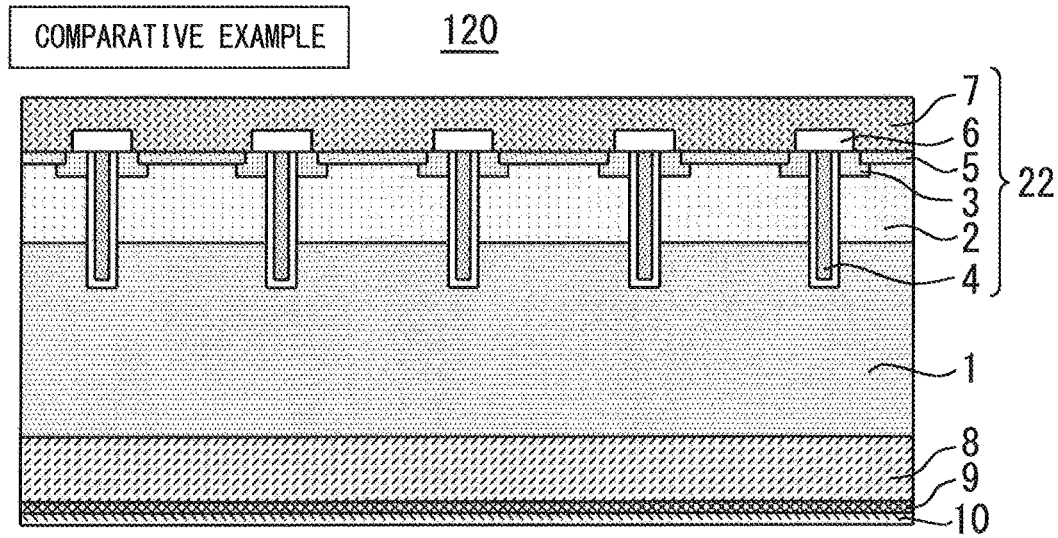
FIG. 23 is a diagram illustrating a semiconductor device according to a comparative example for the first embodiment of the present invention.
Figure 24:
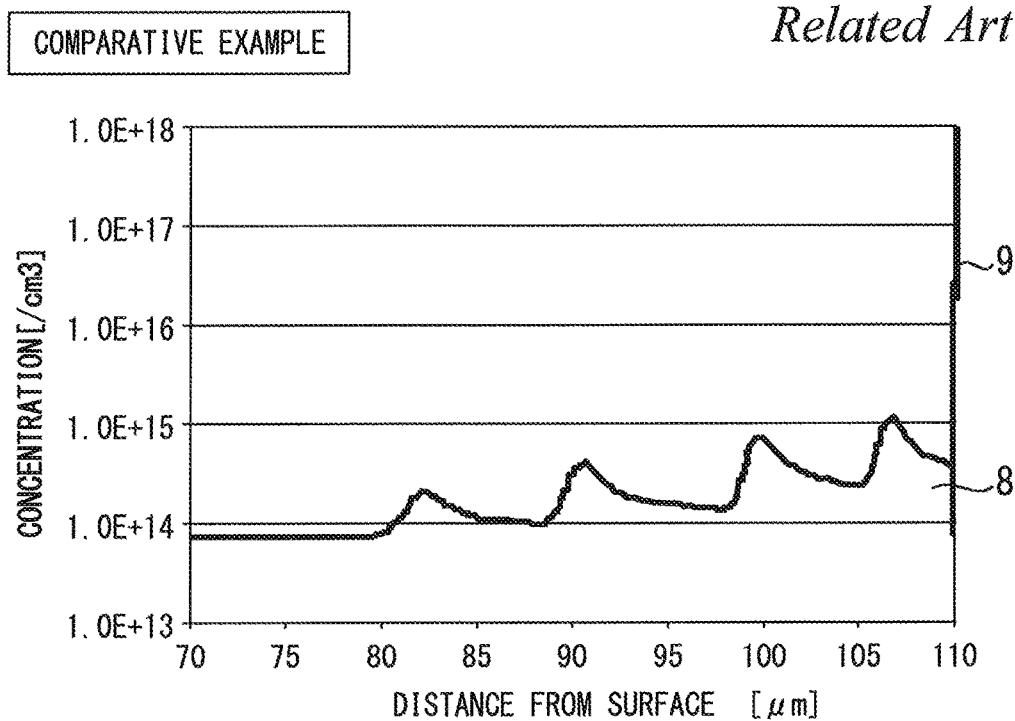
FIG. 24 is a graph illustrating an impurity concentration distribution of the semiconductor device according to the comparative example for the first embodiment of the present invention.

Here, comparative examples shown in FIG. 23 and FIG. 24 will also be used for comparative description. FIG. 23 is a diagram illustrating a semiconductor device 120 according to a comparative example for the first embodiment of the present invention. FIG. 24 is a graph illustrating an impurity concentration distribution of the semiconductor device 120 according to the comparative example for the first embodiment of the present invention. The semiconductor device 120 according to the comparative example is provided with a structure and an impurity concentration distribution similar to those of the semiconductor device 20 shown in FIG. 1 except in that it is not provided with the second n-type buffer layer 11.

An effect of forming the second n-type buffer layer 11 was verified using a device simulation. The device used for the simulation is an IGBT and calculations were carried out under a condition with specific resistance of approximately 67Ω·cm, a wafer thickness of 110 µm and rating of 175 A/1200 V.

Figure 3:
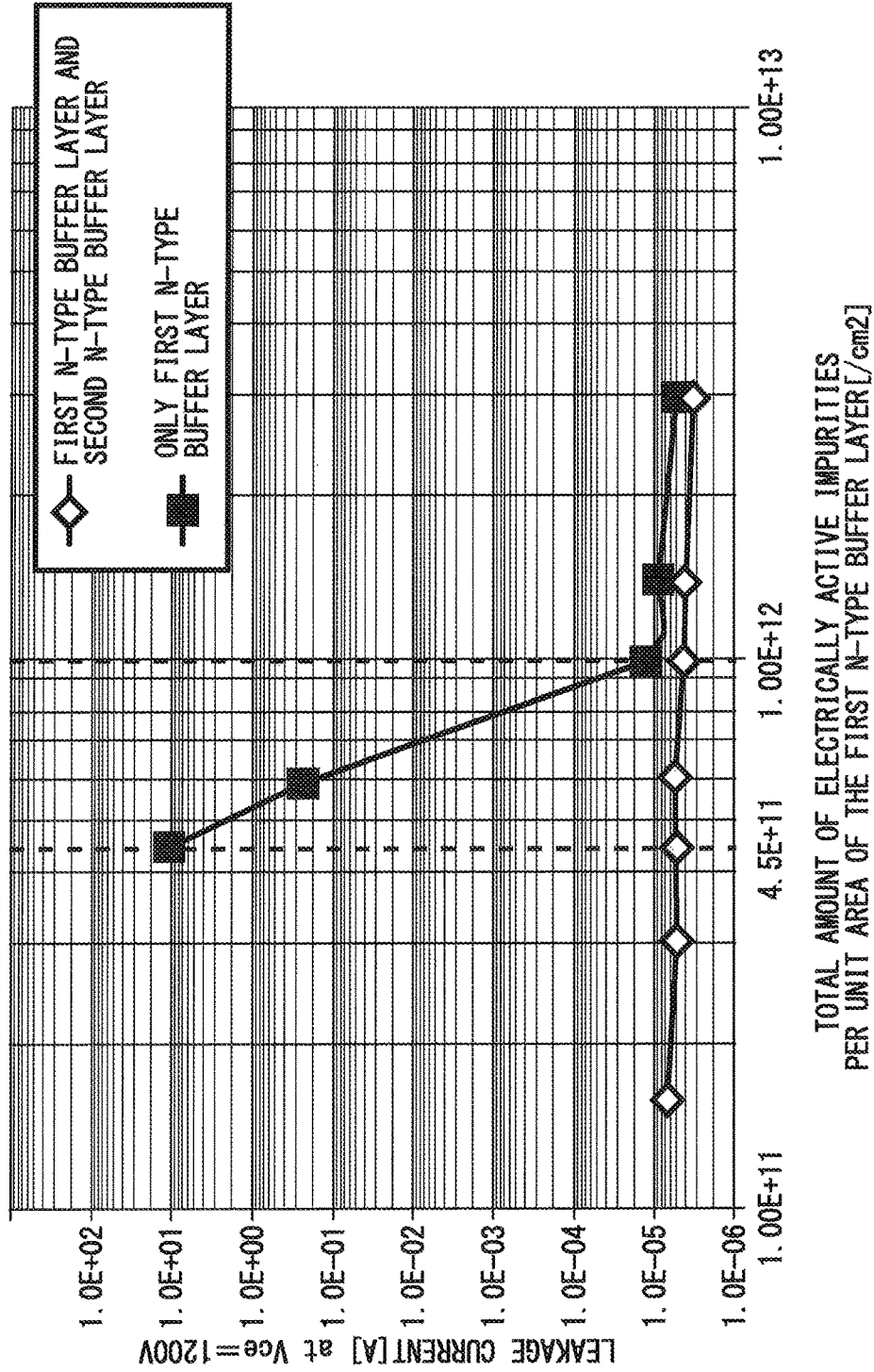
FIG. 3 is a graph for describing operations and effects of the semiconductor device according to the first embodiment of the present invention.

FIG. 3 illustrates a relationship between a total amount of electrically active impurities per unit area of the first n-type buffer layer 8 and a leakage current when 1200 V is applied. It is appreciated that the leakage current is considerably reduced by including the second n-type buffer layer 11 compared to the case where only the first n-type buffer layer 8 is included. This is because the second n-type buffer layer 11 reduces a supply of hole current of the collector into Si. Another reason is that when a voltage is applied, even when a depletion layer is extended to the inside of the first n-type buffer layer 8 which has a low concentration, the second n-type buffer layer 11 having a high concentration plays a role of stopping the depletion layer.

Figure 4:
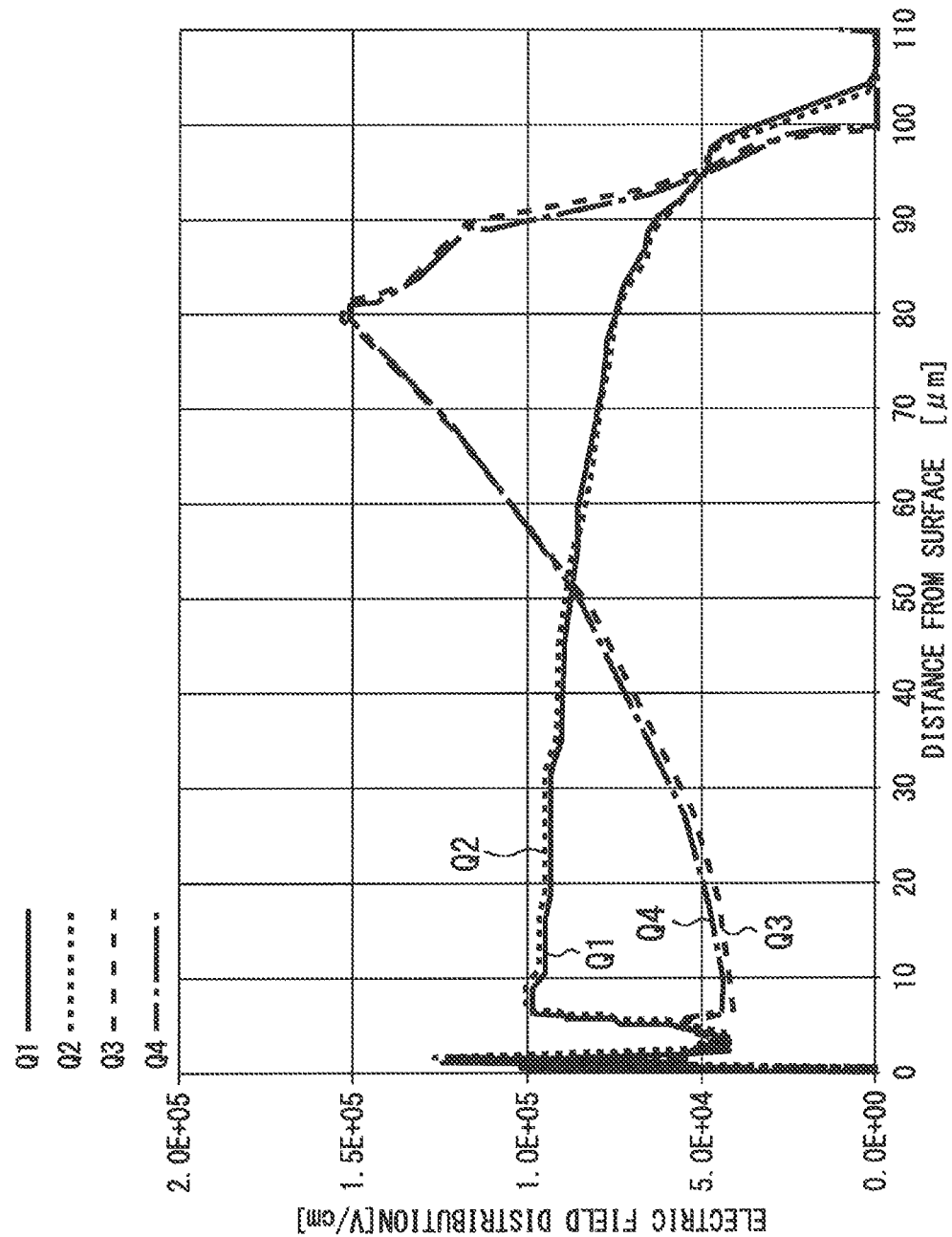
FIG. 4 is a graph for describing operations and effects of the semiconductor device according to the first embodiment of the present invention.
Figure 5:
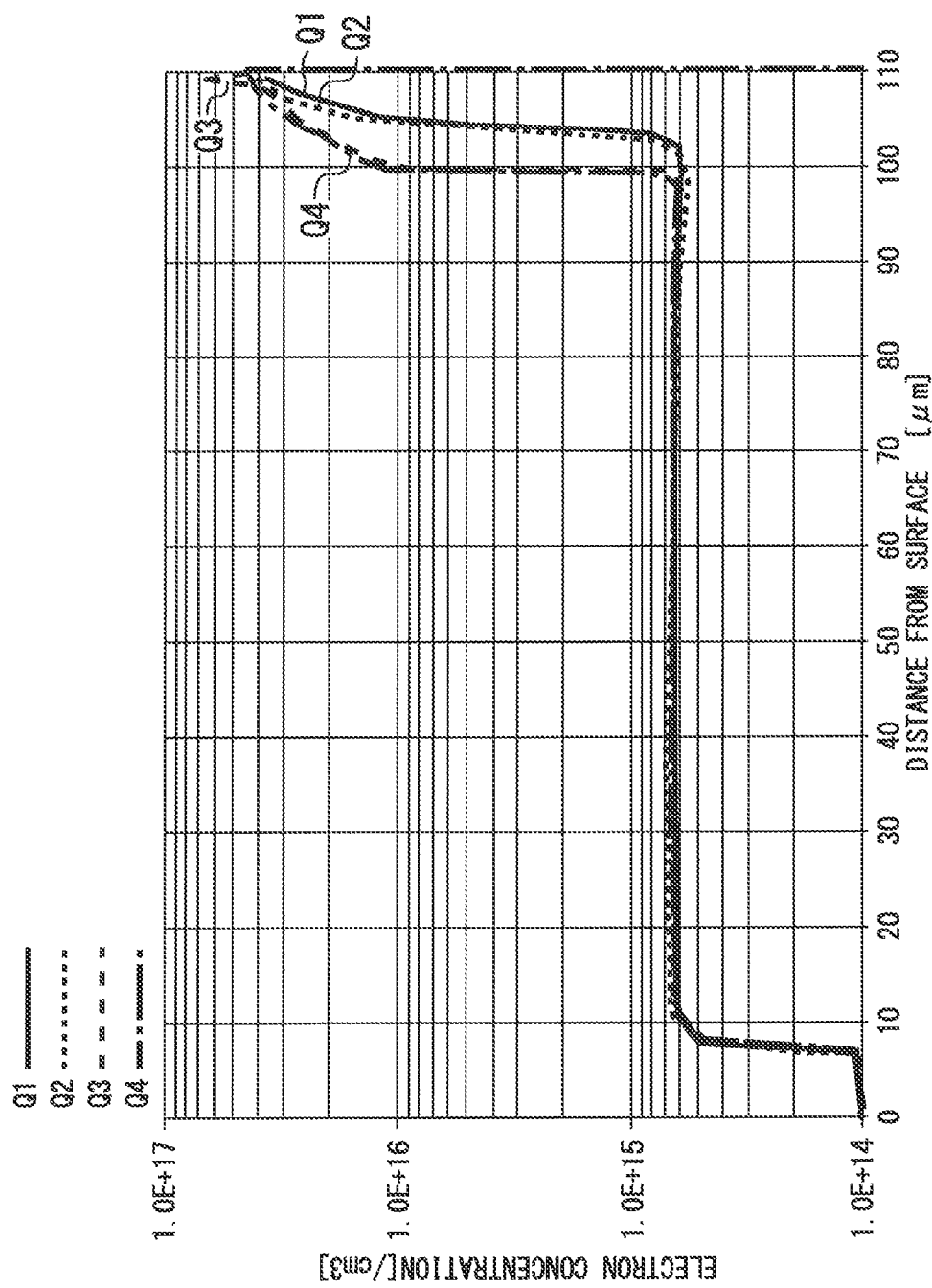
FIG. 5 is a graph for describing operations and effects of the semiconductor device according to the first embodiment of the present invention.
Figure 6:
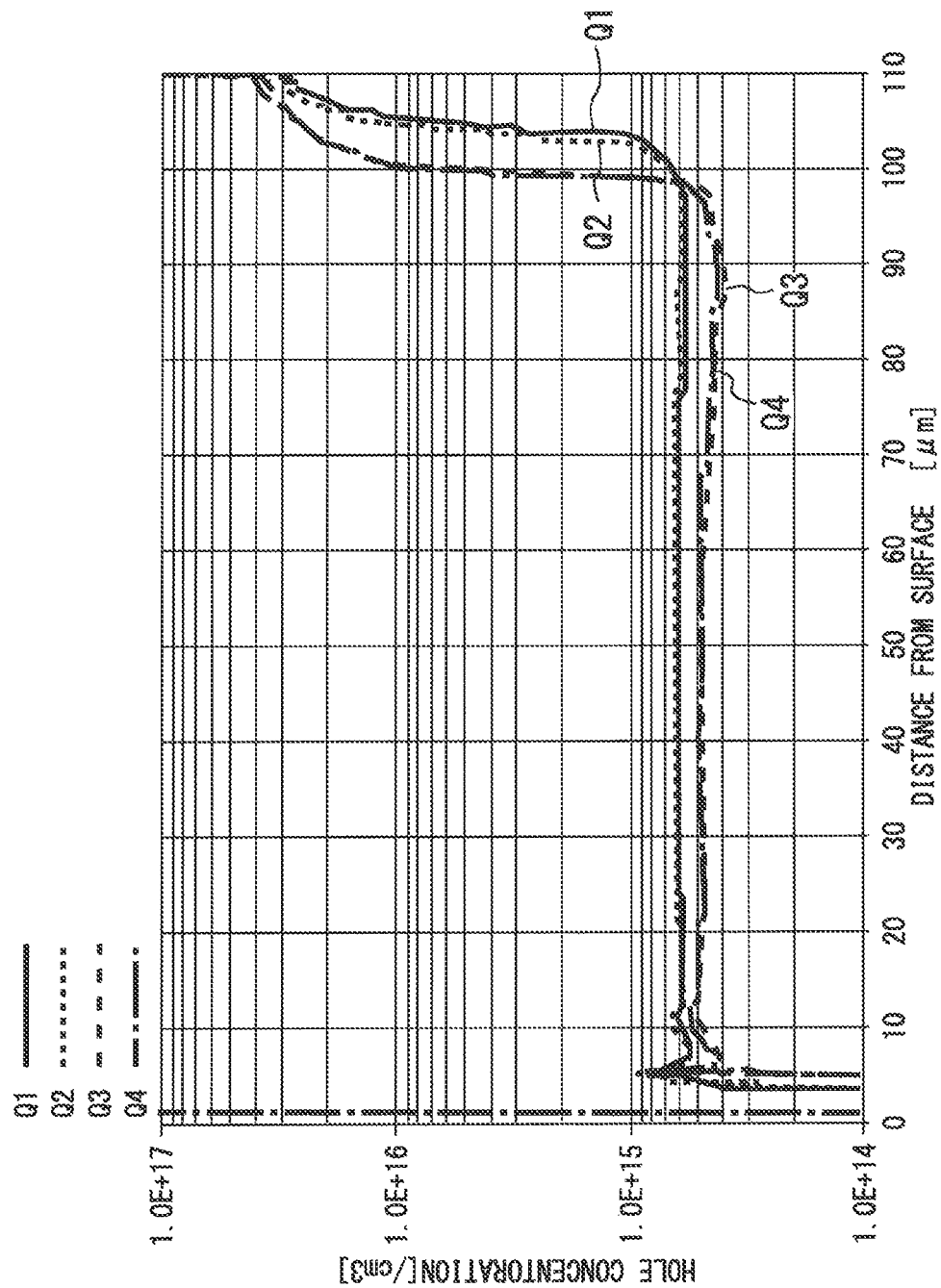
FIG. 6 is a graph for describing operations and effects of the semiconductor device according to the first embodiment of the present invention.

FIG. 4 to FIG. 6 show results of SCSOA tests conducted on an electric field, electron concentration and hole concentration in Si using a simulation. The simulation is conducted on the following four structures. In a first structure Q1, the first n-type buffer layer 8 is set to be relatively low and the second n-type buffer layer 11 is provided. In a second structure Q2, the first n-type buffer layer 8 is set to be relatively low and the second n-type buffer layer 11 is omitted. In a third structure Q3, the first n-type buffer layer 8 is set to be relatively high and the second n-type buffer layer 11 is provided. In a fourth structure Q4, the first n-type buffer layer 8 is set to be relatively high and the second n-type buffer layer 11 is omitted. A condition of SCSOA is Vce=800 V, Vge=15 V, tw=5 µs, and the electric field, electron concentration and hole concentration when t=4 µs are simulated respectively.

FIG. 4 illustrates an electric field distribution in a thickness direction assuming the front surface of the semiconductor device 20 to be the origin. The results of the above four structures are shown by characteristic curves Q1 to Q4 respectively. As is appreciated from the characteristic curves Q3 and Q4 in FIG. 4, when the impurity concentration of the first n-type buffer layer 8 increases, the electric field becomes high at a position of thickness 80 µm from the surface, that is, a joint between the drift layer 1 and the first n-type buffer layer 8. In contrast, as is appreciated from the characteristic curves Q1 and Q2 in FIG. 4, when the impurity concentration of the first n-type buffer layer 8 decreases, the electric field tends to increase on the surface side of the drift layer 1, more specifically, in the vicinity of thickness 5 µm to 6 µm from the surface.

FIG. 5 illustrates an electron concentration in the thickness direction assuming the front surface of the semiconductor device 20 to be the origin. FIG. 6 illustrates a hole concentration in the thickness direction assuming the front surface of the semiconductor device 20 to be the origin. As is appreciated from the characteristic curves Q1 to Q4 in FIG. 5, even when compared to a case where the impurity concentration of the first n-type buffer layer 8 is high and a case where it is low, the electron concentration in the drift layer 1, that is, the substrate 1 does not change much. However, as shown in FIG. 6, the hole concentration in the drift layer 1 decreases according to the characteristic curves Q3 and Q4 where the impurity concentration of the first n-type buffer layer 8 is high. This is because holes are extinguished inside the first n-type buffer layer 8. As a result, a shortage of carriers occurs on the reverse side of the drift layer 1. The lack of carriers causes the depletion layer to expand between the drift layer 1 and the first n-type buffer layer 8. Accordingly, the electric field increases and positive feedback takes place, producing an excessively high electric field.

Note that when a case where the second n-type buffer layer 11 is provided and a case where it is not are compared, there is substantially no difference in the electric field distribution in the semiconductor device 20. This is because the second n-type buffer layer 11 can prevent extinction of holes.

Figure 7:
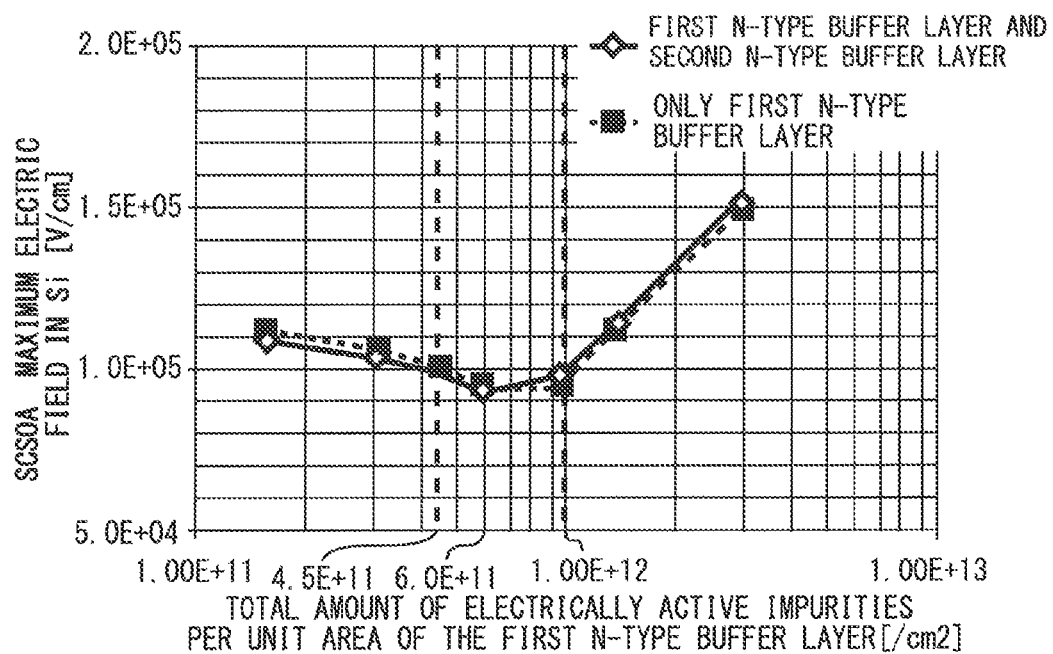
FIG. 7 is a graph for describing operations and effects of the semiconductor device according to the first embodiment of the present invention.

FIG. 7 shows simulation results indicating a relationship between a total amount of electrically active impurities per unit area of the first n-type buffer layer 8 and a maximum electric field value in the semiconductor device 20 during an SCSOA test. As shown in FIG. 7, a minimum value of the maximum electric field is obtained in the vicinity of the total amount of impurities of $6\times10^{11}$ cm$^{-2}$. Reasons for such a tendency will be described. First, the lower the impurity concentration of the first n-type buffer layer 8, the higher the electric field becomes on the surface side of the semiconductor device 20. Conversely, the higher the impurity concentration of the first n-type buffer layer 8, the higher the electric field becomes on the reverse side of the semiconductor device 20. Therefore, from the standpoint of reducing the maximum electric field in the semiconductor device 20, the impurity concentration of the first n-type buffer layer 8 has an exactly appropriate range.

According to the graph shown in FIG. 7 in particular, by setting a total amount of electrically active impurities per unit area of the first n-type buffer layer 8 to within a range of $4.5 \times 10^{11}$ cm$^{-2}$ to $1.0 \times 10^{12}$ cm$^{-2}$, it is possible to reduce the maximum electric field in the semiconductor device 20 to $1.0 \times 10^5$ V/cm or less. As a result, it is possible to reduce the maximum electric field in the semiconductor device 20 and satisfy a high SCSOA.

When the results in FIG. 3 and FIG. 7 are combined, it is possible to maintain a high SCSOA while suppressing the leakage current by providing the second n-type buffer layer 11 and containing the impurity concentration of the first n-type buffer layer 8 within an appropriate range.

Note that formation of the first n-type buffer layer 8 has the following merits. First, compared to the second n-type buffer layer 11, the first n-type buffer layer 8 provides low sensitivity to foreign substances and damages on the reverse side during the formation, suppresses variations of the leakage current, and can improve quality. Furthermore, by stopping the depletion layer at the time of turn-off in the first n-type buffer layer 8, can thereby prevent depletion of carriers and suppress oscillation at the time of turn-off. Oscillation of a voltage or current may cause radiation noise. Especially when the wafer is made thinner to improve performance, the depletion layer is more likely to reach the reverse side when a voltage is applied to the device. It is preferable to provide the first n-type buffer layer 8 as a solution to these problems.

Figure 8:
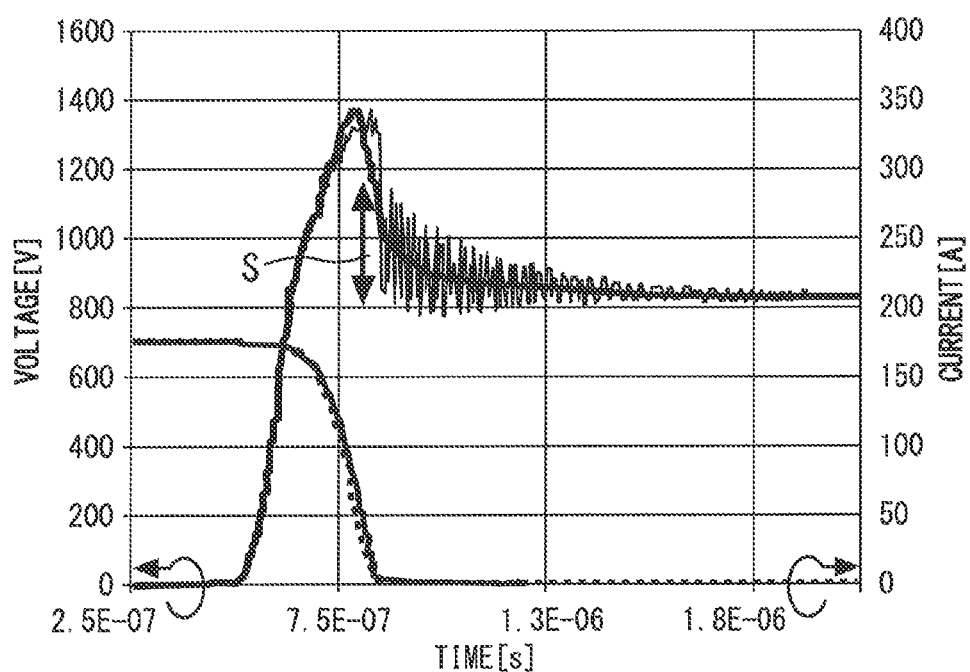
FIG. 8 is a graph for describing operations and effects of the semiconductor device according to the first embodiment of the present invention.

FIG. 8 shows an example of an oscillation waveform at the time of turn-off wherein:

—— First N-Type Buffer Layer (Low Concentration) and Second N-Type Buffer Layer;

—— First N-Type Buffer Layer (High Concentration) and Second N-Type Buffer Layer;

—— First N-Type Buffer Layer (Low Concentration) and Second N-Type Buffer Layer; and ----- First N-Type Buffer Layer (High Concentration) and Second N-Type Buffer Layer.

An arrow marked S in FIG. 8 denotes a "voltage vibration width at the start of turn-off oscillation." The voltage vibration width at the start of turn-off oscillation corresponds to a difference between a minimum voltage value and a maximum voltage value when a voltage becomes a maximum value according to turn-off, and then decreases and the voltage starts increasing again due to an oscillation.

Figure 9:
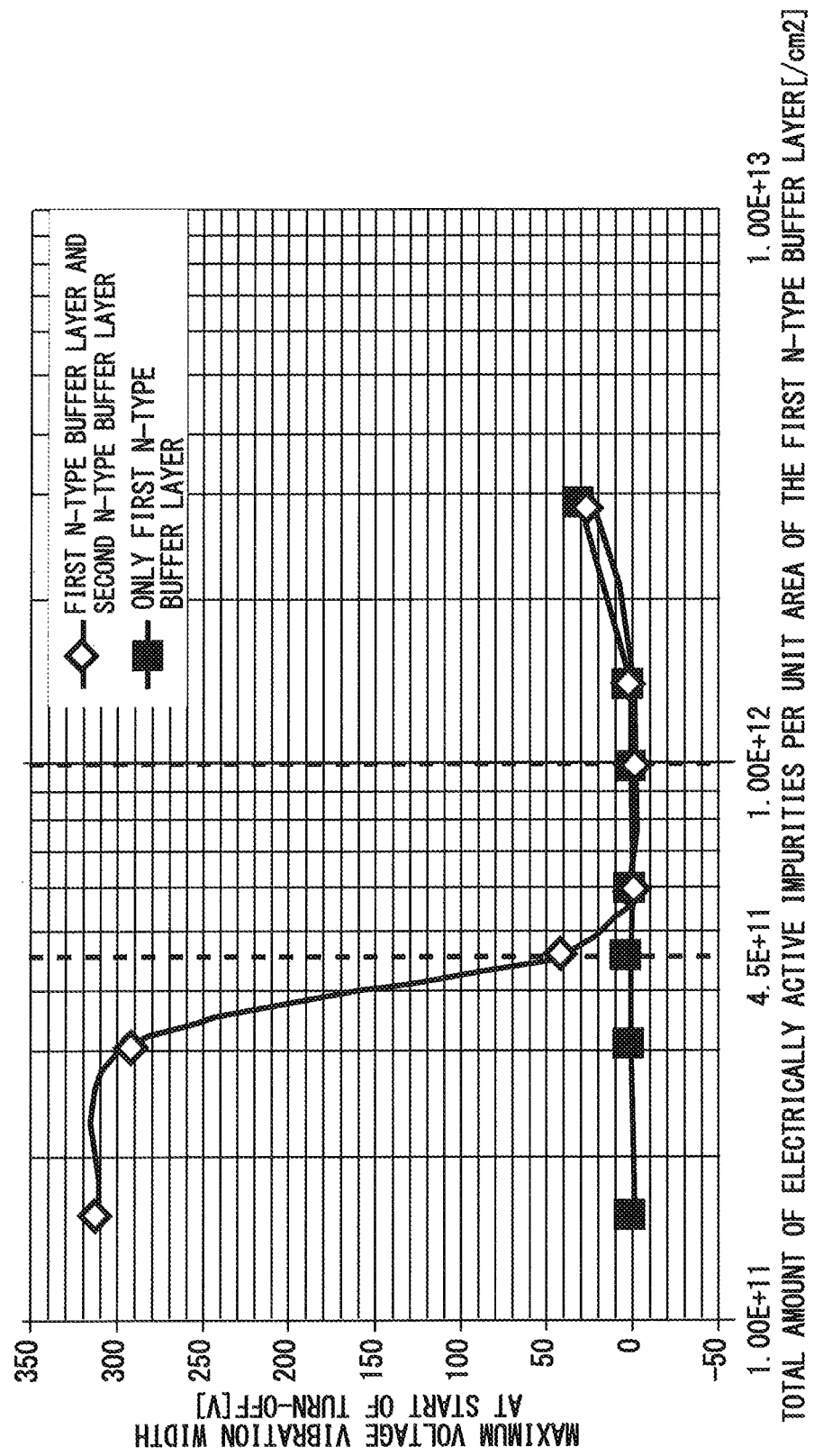
FIG. 9 is a graph for describing operations and effects of the semiconductor device according to the first embodiment of the present invention.

FIG. 9 shows a relationship between a total amount of electrically active impurities per unit area of the first n-type buffer layer 8 and a maximum voltage vibration width at the start of turn-off oscillation. Since the growth of the depletion layer at the time of turn-off varies depending on time, the growth of the depletion layer is confirmed using a simulation in a static case. When the impurity concentration of the first n-type buffer layer 8 is low, oscillation is more likely to occur. When the impurity concentration of the first n-type buffer layer 8 is high, oscillation of a voltage can be suppressed. More specifically, it can be read from FIG. 9 that when the total amount of electrically active impurities per unit area becomes $4.5 \times 10^{11}$ cm$^{-2}$ or greater, the oscillation voltage is suppressed.

Figure 10:
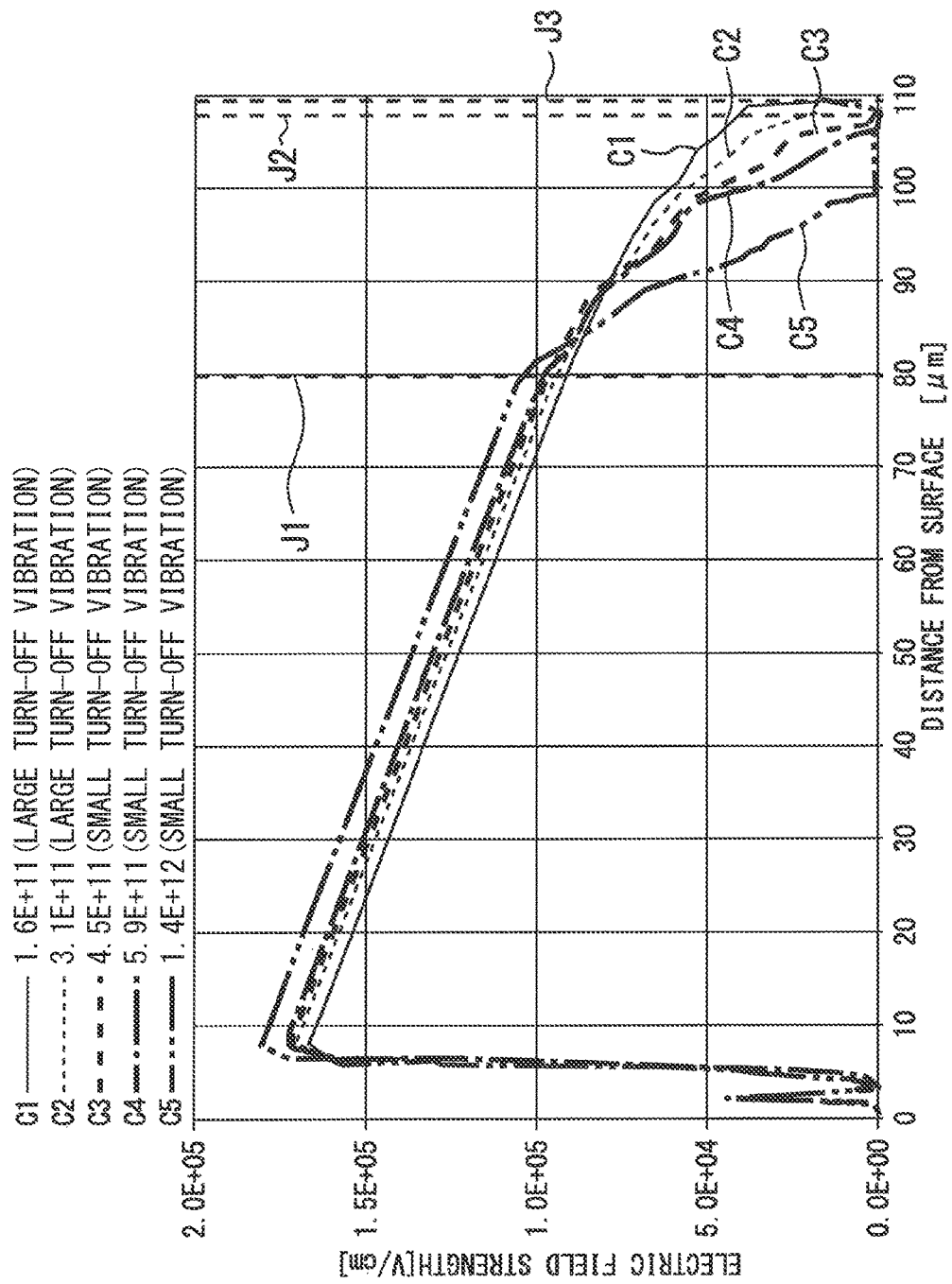
FIG. 10 is a graph for describing operations and effects of the semiconductor device according to the first embodiment of the present invention.

FIG. 10 is a diagram illustrating electric field strength in the semiconductor device 20 when a rated voltage Vce=1200 V is applied. The total amount of impurities of the first n-type buffer layer 8 is set to five different total amounts of impurities and characteristic curves C1 to C5 showing their respective calculation results are shown. The relationship between the five total amounts of impurities and the characteristic curves C1 to C5 is as follows: C1 is $1.6 \times 10^{11}$ cm$^{-2}$; C2 is $3.1 \times 10^{11}$ cm$^{-2}$; C3 is $4.5 \times 10^{11}$ cm$^{-2}$; C4 is $5.9 \times 10^{11}$ cm$^{-2}$; C5 is $1.4 \times 10^{12}$ cm$^{-2}$. Longitudinal lines shown by broken lines in FIG. 10 denote a joint J1 between the drift layer 1 and the first n-type buffer layer 8, a joint J2 between the first n-type buffer layer 8 and the second n-type buffer layer 11 and a joint J3 between the second n-type buffer layer 11 and the collector layer 9 respectively. Since the impurity concentration in the first n-type buffer layer 8 is higher than in the drift layer 1, the depletion layer hardly extends in the first n-type buffer layer 8.

Figure 11:
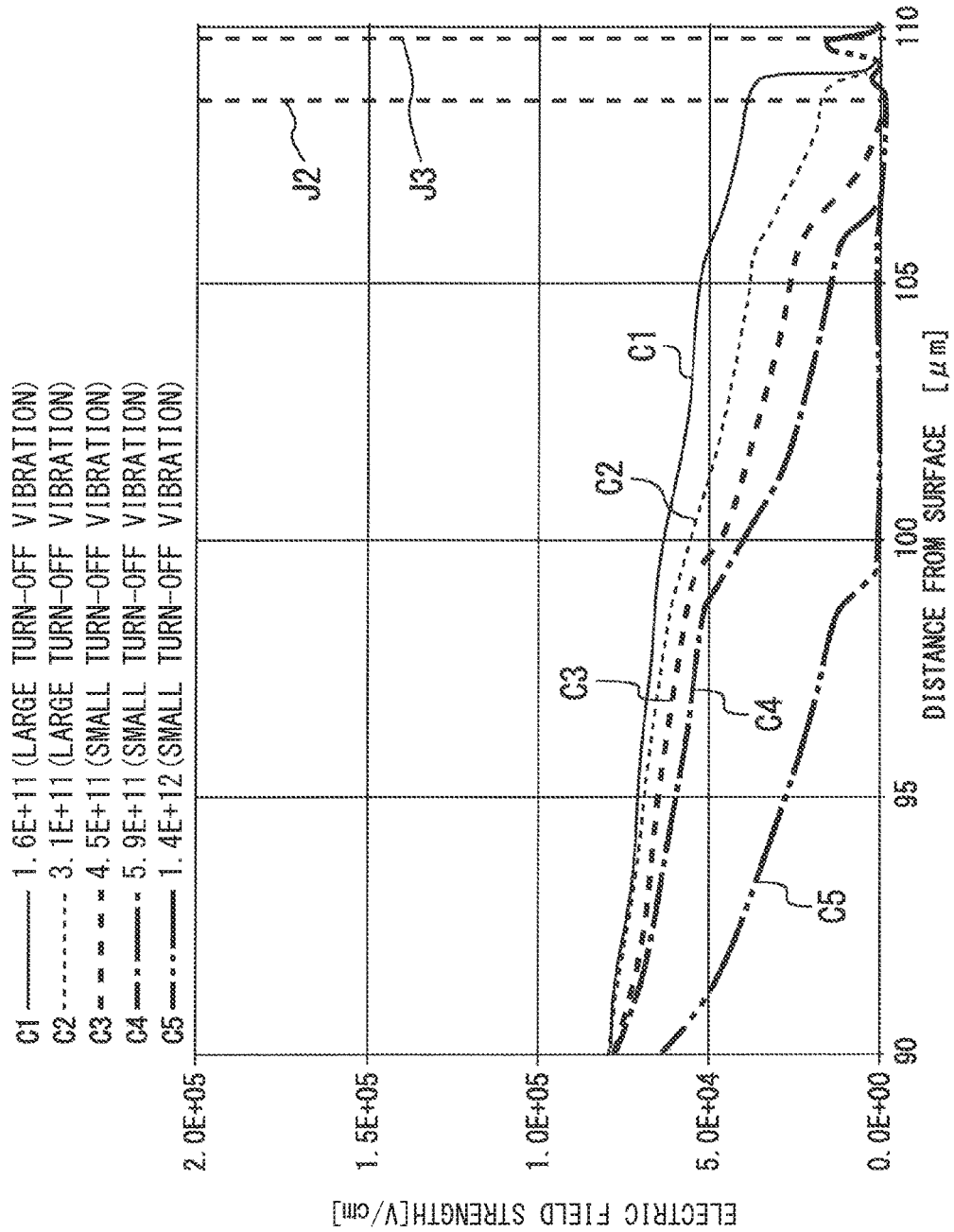
FIG. 11 is a graph for describing operations and effects of the semiconductor device according to the first embodiment of the present invention.

FIG. 11 is an enlarged view of the region of a thickness of 90 μm to 110 μm in FIG. 10. The region enlarged in FIG. 11 corresponds to the region from the first n-type buffer layer 8 to the collector layer 9. In order to prevent oscillation at the time of turn-off, it is preferable to prevent the depletion layer from reaching the second n-type buffer layer 11 when a rated voltage is applied in a static state or during switching operation or when a withstand voltage is held in the off state. In this respect, according to FIG. 11, the depletion layer does not reach the second n-type buffer layer 11 on the characteristic curves C3 to C5 where a total amount of electrically active impurities per unit area is set to $4.5 \times 10^{11}$ cm$^{-2}$ or greater. A total amount of impurities of $4.5 \times 10^{11}$ cm$^{-2}$ coincides with a minimum total amount of impurities for suppressing an oscillating voltage at the time of turn-off.

As described above, according to the first embodiment, in the semiconductor device 20 provided with the first and second n-type buffer layers 8 and 11, a total amount of electrically active impurities per unit area of the first n-type buffer layer 8 is set to $1.0 \times 10^{12}$ cm$^{-2}$ or less. Since the upper limit value of the total amount of impurities of the first n-type buffer layer 8 is determined appropriately so as to be able to reduce a maximum electric field in the semiconductor device 20, the SCSOA can be maintained so as to have a preferable characteristic. On the other hand, the lower limit of the total amount of electrically active impurities per unit area of the first n-type buffer layer 8 is preferably $4.5 \times 10^{11}$ cm$^{-2}$ or greater. An effect of suppressing an oscillation at the time of turn-off is achieved in this way. That is, from the results in FIG. 3, FIG. 7 and FIG. 9, it is preferable to set the total amount of electrically active impurities per unit area of the first n-type buffer layer 8 to within a range of $4.5 \times 10^{11}$ cm$^{-2}$ to $1.0 \times 10^{12}$ cm$^{-2}$. In this way, it is possible to provide a wide SCSOA and a high turn-off oscillation suppression effect while suppressing a leakage current.

Note that the impurity concentration of the second n-type buffer layer 11 needs to be higher than that of the first n-type buffer layer 8. However, in order to achieve a higher leakage current suppression effect and a higher maximum electric field suppression effect in the semiconductor device 20, the impurity concentration of the second n-type buffer layer 11 also has a preferable range. The scale on the vertical axis of the graph shown in FIG. 2 is a logarithmic one, and in FIG. 2, the second n-type buffer layer 11 according to the first embodiment has a peak of impurity concentration distribution of $3 \times 10^{16}$ cm$^{-3}$ as an example. A concentration peak value of the impurity concentration distribution in the thickness direction of the second n-type buffer layer 11 may be set so as to fall within a range of $3 \times 10^{16}$ cm$^{-3}$ to $6 \times 10^{16}$ cm$^{-3}$ as an example. Furthermore, the total amount of electrically active impurities per unit area of the second n-type buffer layer 11 may also be set so as to fall within a range of $7\times10^{11}$ cm$^{-2}$ to $1.4\times10^{12}$ cm$^{-2}$.

Note that the following semiconductor device may also be provided as a modification of the semiconductor device 20 according to the first embodiment.

The semiconductor device 20 has been described in the first embodiment in which the semiconductor material is silicon, the dopant of the first n-type buffer layer 8 is protons, and the dopant of the second n-type buffer layer 11 is phosphor or arsenic. However, the semiconductor material of the drift layer 1 may be silicon carbide, that is, SiC. In this case, the dopant of the first n-type buffer layer 8 may be protons and the dopant of the second n-type buffer layer 11 may be nitrogen.

The target of the first embodiment is an IGBT provided with a trench gate, but as a modification, the target may be an IGBT provided with a planer gate. Furthermore, a MOSFET may be provided by omitting the collector layer 9.

Figure 12:
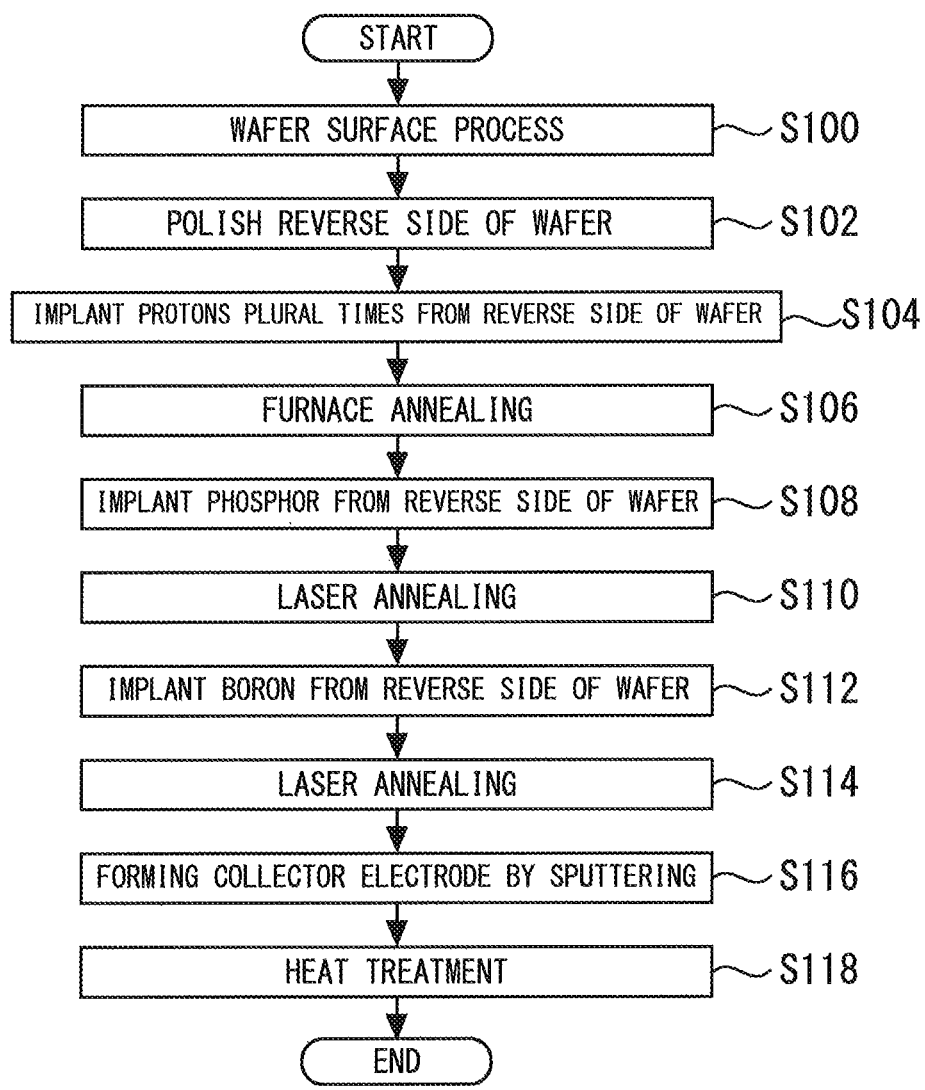
FIG. 12 is a diagram for describing a method for manufacturing the semiconductor device according to the first embodiment of the present invention.

FIG. 12 to FIG. 22 are diagrams for describing a method for manufacturing the semiconductor device 20 according to the first embodiment of the present invention. FIG. 12 is a flowchart illustrating a method for manufacturing the semiconductor device 20 according to the first embodiment. A surface process for manufacturing a surface structure, that is, the MOSFET part 22 is similar to a method for manufacturing a publicly known IGBT and not a new item. Therefore, detailed description of the surface process is omitted.

Figure 13:
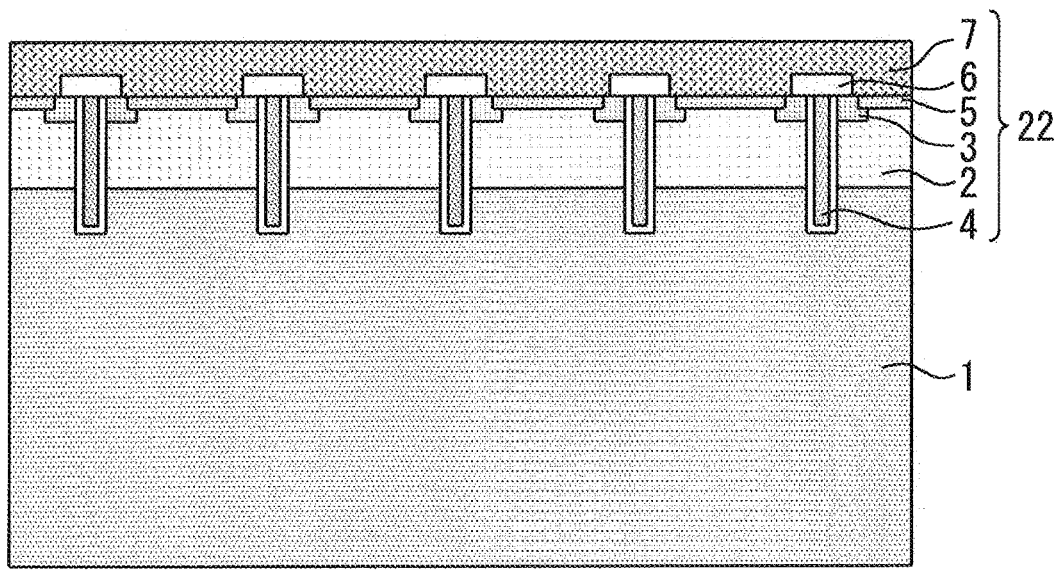
FIG. 13 is a diagram for describing a method for manufacturing the semiconductor device according to the first embodiment of the present invention.

(Step S100) In the flowchart shown in FIG. 12, first, a semiconductor wafer at the time of completion of the surface process is prepared as shown in FIG. 13. The semiconductor wafer is configured by forming the MOSFET part 22 on the substrate 1 made of silicon. Noted that, at a predetermined stage after completion of a reverse side process shown in FIG. 12, the semiconductor device 20 formed into a chip will be provided by dicing the semiconductor wafer. At a point in time in FIG. 13, a wafer thickness is on the order of 700 μm and is substantially the same as that of a bare wafer.

Figure 14:
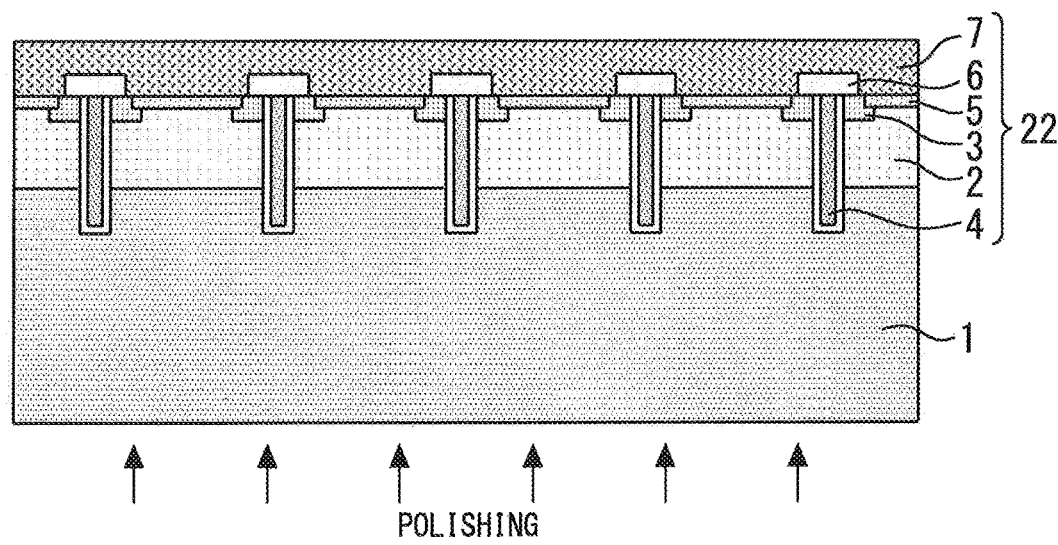
FIG. 14 is a diagram for describing a method for manufacturing the semiconductor device according to the first embodiment of the present invention.

(Step S102) Next, as shown in FIG. 14, the reverse side of the semiconductor wafer, that is, the reverse side of the drift layer 1 is polished to a desired thickness using a grinder or wet etching. In the first embodiment, polishing is performed until the wafer thickness becomes 110 μm as an example.

Next, a "first buffer layer formation step" is performed. In the first buffer layer formation step, protons are ion-implanted onto the reverse side of the drift layer 1 to a first depth and heat treatment is applied. In this way, the first n-type buffer layer 8 is formed, which has the impurity concentration distribution in the thickness direction with a first concentration peak as shown in FIG. 2.

Figure 15:
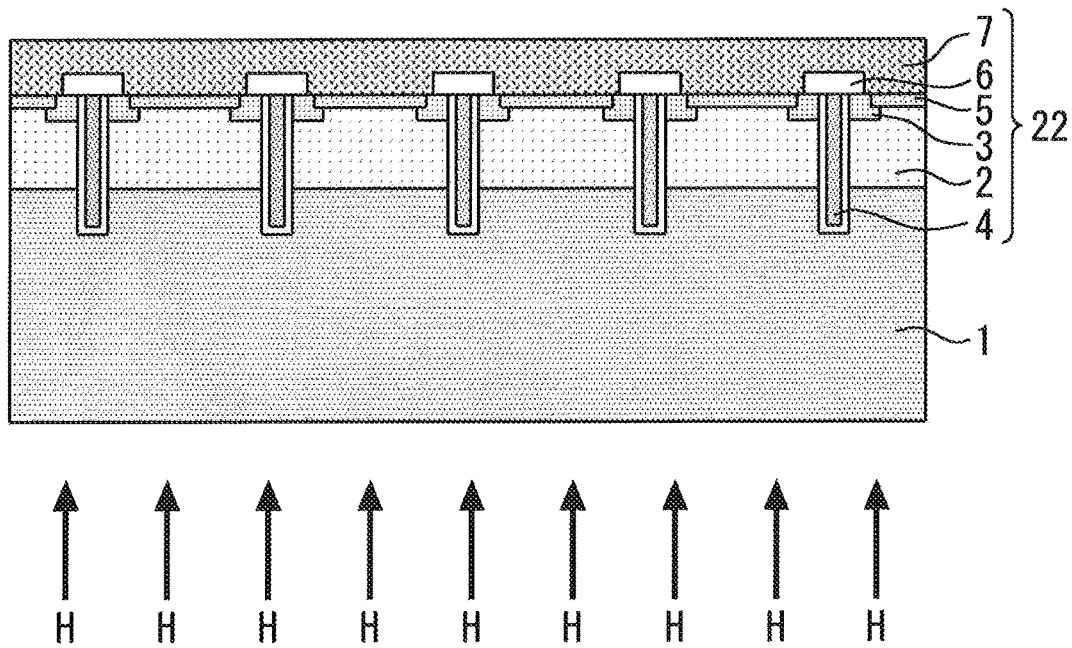
FIG. 15 is a diagram for describing a method for manufacturing the semiconductor device according to the first embodiment of the present invention.

(Step S104) More specifically, first, as shown in FIG. 15, protons are implanted from the reverse side at an acceleration voltage of maximum 1500 keV a plurality of times. The range of protons is 6 μm at 500 keV and on the order of 30 μm at 1500 keV. In the first buffer layer formation step, it is preferable to perform ion implantation a plurality of times at an acceleration voltage of $1.5\times10^{6}$ eV or less. Although a broader impurity concentration gradient is formed by executing activation annealing to diffuse protons, it is preferable to perform implantations a plurality of times while changing the acceleration voltage to form an impurity concentration gradient closer to a Gaussian distribution.

Figure 22:
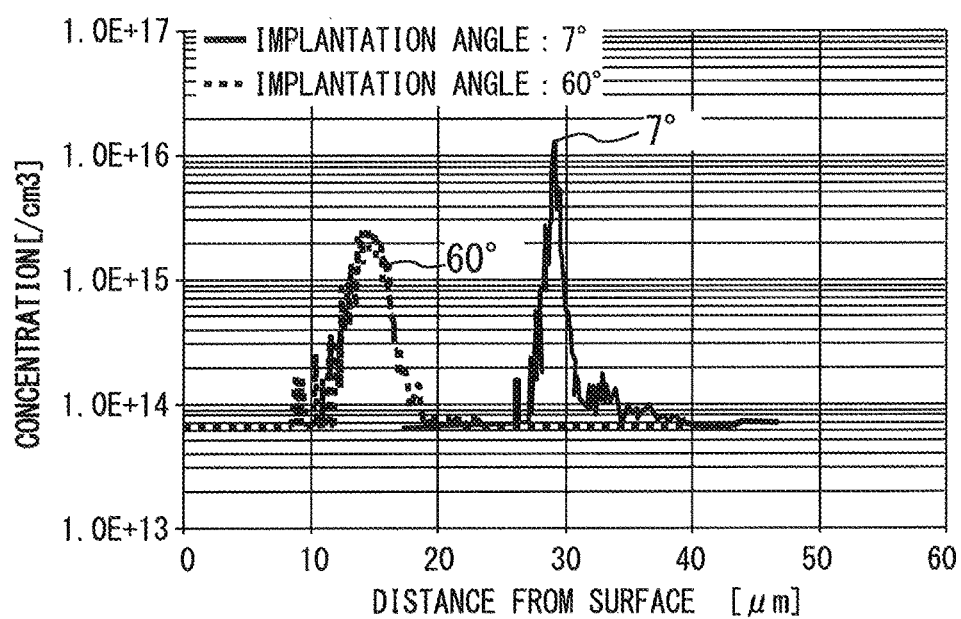
FIG. 22 is a diagram for describing a method for manufacturing the semiconductor device according to the first embodiment of the present invention.

Furthermore, in the first buffer layer formation step, it is preferable to set the implantation angle of protons to 7 degrees or more and 60 degrees or less. By increasing the ion implantation angle to a certain degree, it is possible to make the impurity concentration gradient in the thickness direction of the first n-type buffer layer 8 gentler. This will be described more specifically. FIG. 22 illustrates an impurity concentration profile when protons of $1.0\times10^{12}$ cm$^{-2}$ are implanted into the semiconductor substrate at an implantation angle of 7 degrees and 60 degrees. Even when the proton implantation angle is set to a small angle, protons are diffused by executing activation annealing, providing a broad profile, but its full width at half maximum is small and its impurity concentration gradient is acute. In this case, to obtain a profile similar to a Gaussian distribution, implantation needs to be performed a plurality of times while changing the acceleration voltage. Although the range can be reduced by setting a large ion implantation angle, that is, setting an ion implantation angle to within a range of 7 to 60 degrees, for example, a gentle impurity concentration gradient such as an impurity concentration distribution of an ion implantation angle of 60 degrees shown in FIG. 22 can be created more easily. As a result, there are such advantages that the number of implantations can be reduced, and labor and time required to adjust a beam current when changing the acceleration voltage can be reduced. Note that the implantation depth is a function of an implantation angle θ and the implantation depth is substantially determined by cos θ. The range when θ=60 degrees becomes half of that compared to when θ=7 degrees. When ion implantation is performed a plurality of times, by performing implantation set to 7 degrees and implantation set to 60 degrees, it is possible to arrange the impurity concentration peak position of the first n-type buffer layer 8 in the vicinity of depth 30 μm and in the vicinity of depth 15 μm. It is thereby possible to make well balanced the growth of the depletion layer when the withstand voltage is held.

Figure 16:
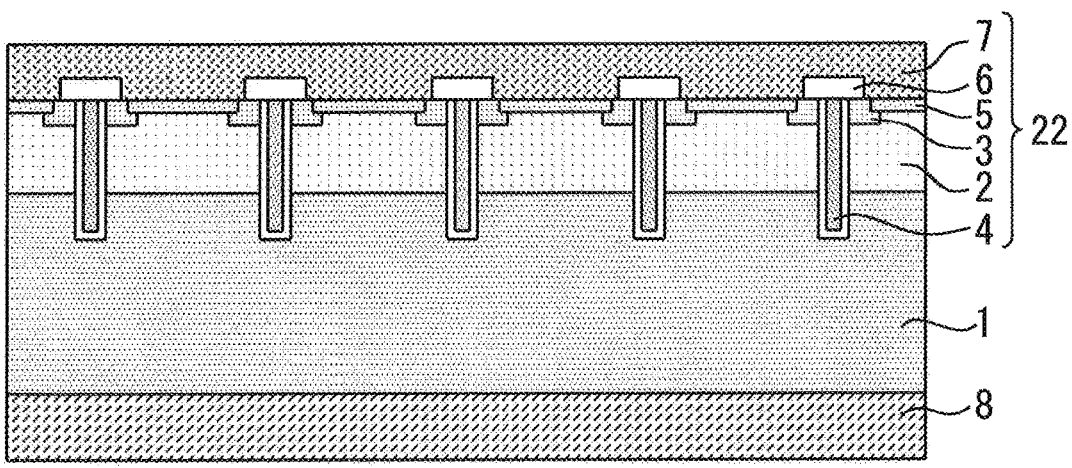
FIG. 16 is a diagram for describing a method for manufacturing the semiconductor device according to the first embodiment of the present invention.

(Step S106) Next, furnace annealing is performed at on the order of 350° C. to 450° C. In this way, protons are activated and the first n-type buffer layer 8 is formed as shown in FIG. 16.

Next, a "second buffer layer formation step" is performed. In the second buffer layer formation step, group V elements are ion-implanted into the reverse side of the first n-type buffer layer 8 to a second depth which is shallower than the first depth and heat treatment is performed. In this way, the second n-type buffer layer 11 as shown in FIG. 2 is formed, which has an impurity concentration distribution in the thickness direction with a second concentration peak which is higher than the first concentration peak.

Figure 17:
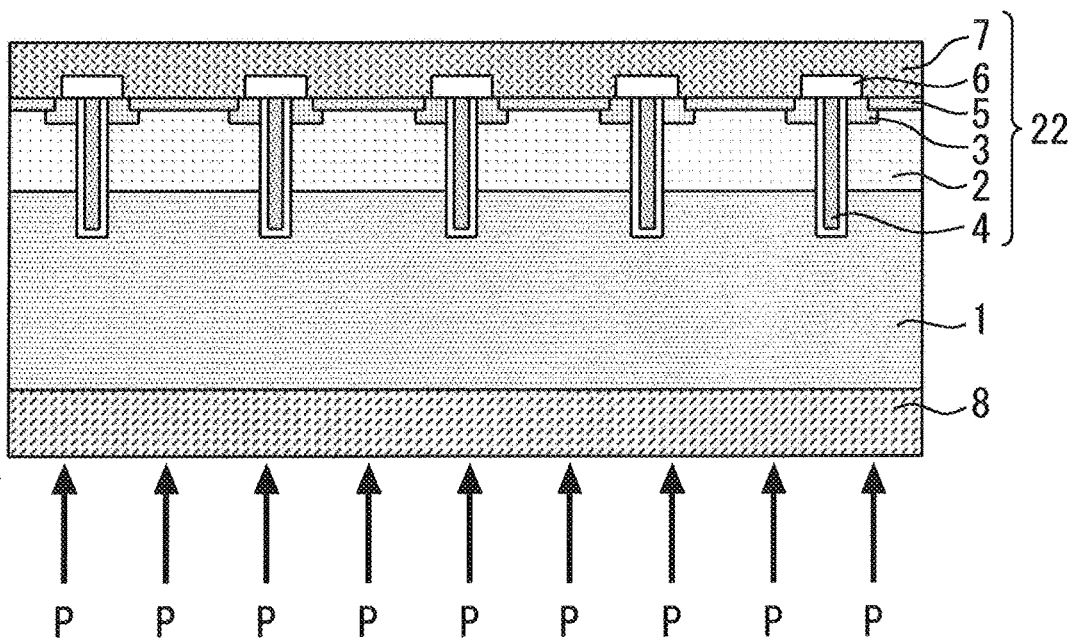
FIG. 17 is a diagram for describing a method for manufacturing the semiconductor device according to the first embodiment of the present invention.

(Step S108) More specifically, first, phosphor is implanted at an acceleration voltage of 1 MeV or less as shown in FIG. 17. Thus, the second n-type buffer layer 11 is formed in a shallow part on the reverse side of the drift layer 1, in other words, in a shallow part on the reverse side of the first n-type buffer layer 8. Note that arsenic may be implanted instead of phosphor.

Figure 18:
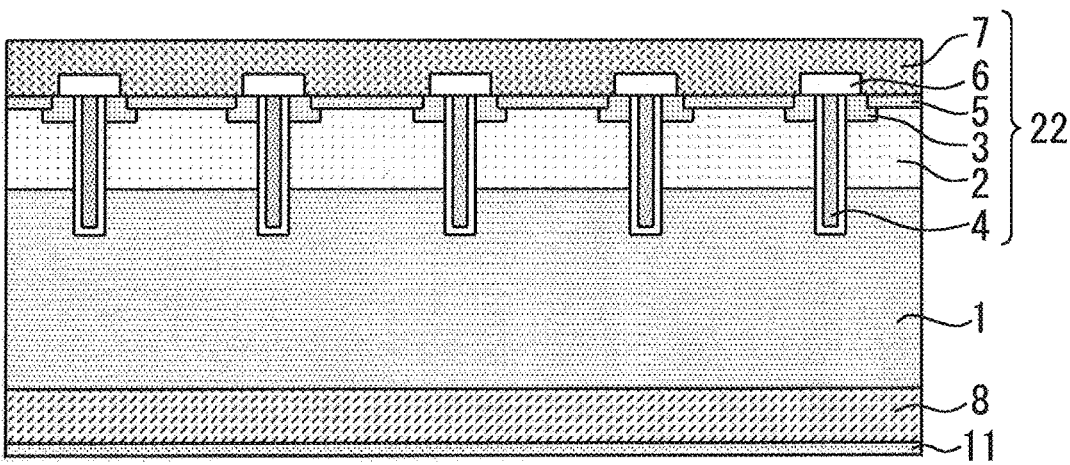
FIG. 18 is a diagram for describing a method for manufacturing the semiconductor device according to the first embodiment of the present invention.

(Step S110) After that, activation is performed using laser annealing and the second n-type buffer layer 11 is formed as shown in FIG. 18.

Thus, it is preferable to perform furnace annealing in the first buffer layer formation step and perform laser annealing in the second buffer layer formation step.

Figure 19:
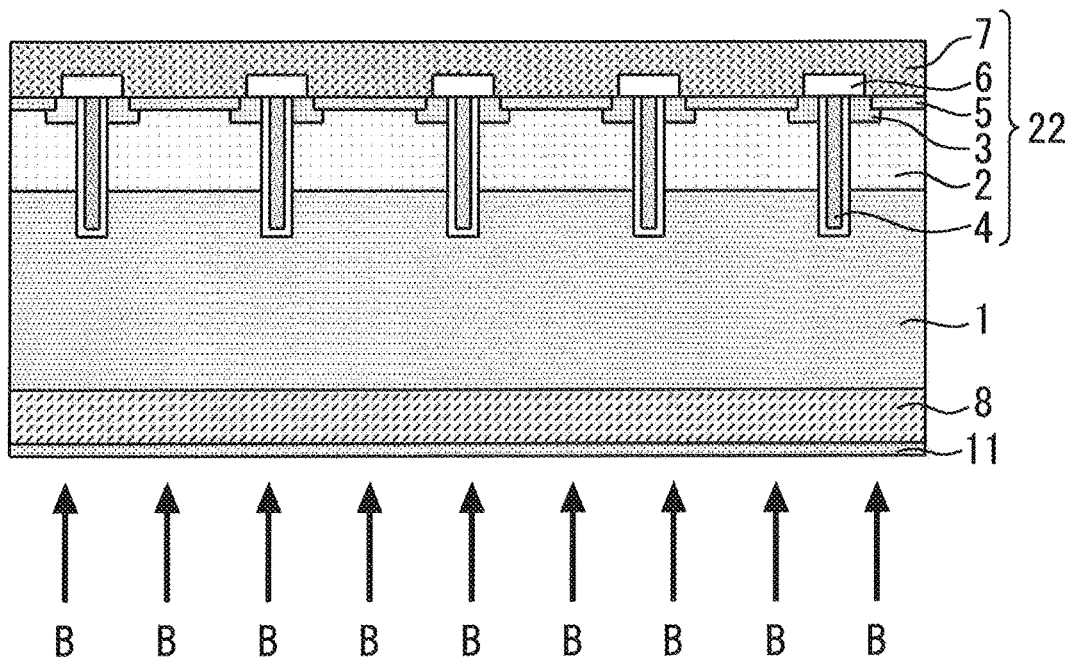
FIG. 19 is a diagram for describing a method for manufacturing the semiconductor device according to the first embodiment of the present invention.

(Step S112) Next, as shown in FIG. 19, boron is implanted into the reverse side of the second n-type buffer layer 11 to form the collector layer 9.

Figure 20:
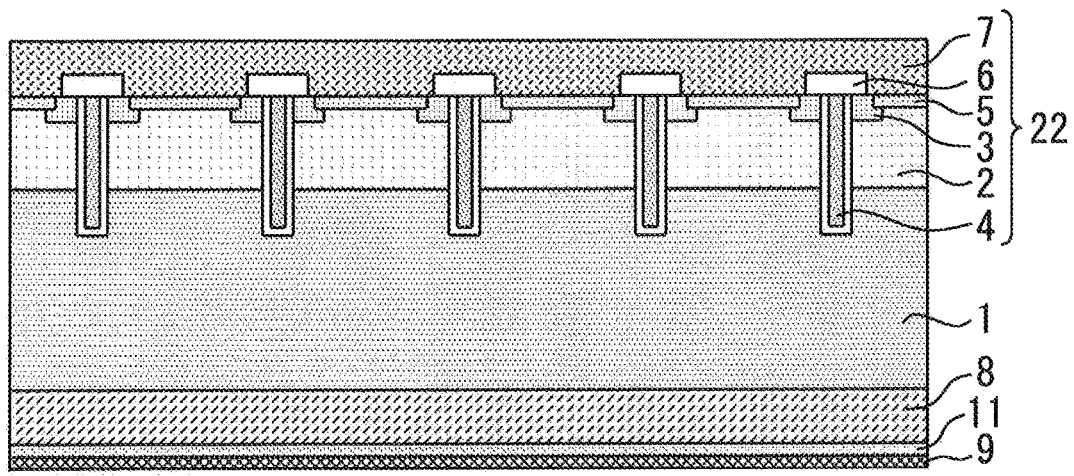
FIG. 20 is a diagram for describing a method for manufacturing the semiconductor device according to the first embodiment of the present invention.

(Step S114) Next, laser annealing is performed and the collector layer 9 is formed as shown in FIG. 20.

Figure 21:
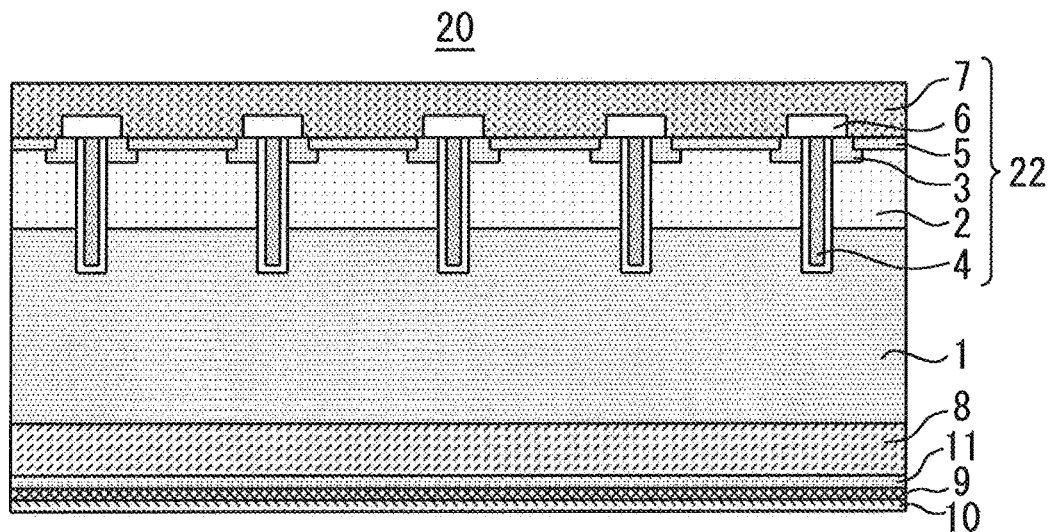
FIG. 21 is a diagram for describing a method for manufacturing the semiconductor device according to the first embodiment of the present invention.

(Step S116) After that, as shown in FIG. 21, the collector electrode 10 is created through sputtering. The material of the collector electrode 10 may be Al/Ti/Ni/Au or AlSi/Ti/Ni/Au or the like.

(Step S118) Lastly, heat treatment is performed to reduce contact resistance between the n-type silicon substrate 1 and the collector electrode 10. Note that as a modification, the heat treatment for activation of protons in step S106 may be omitted and heat treatment performed when the collector electrode 10 is formed may also serve as such omitted heat treatment.

At the same acceleration voltage, protons have a relatively large range, and so protons are suitable for forming the first n-type buffer layer 8 up to a deep region of the reverse side of the drift layer 1. On the other hand, group V elements have relatively short ranges, and it is thereby possible to accurately form a high impurity concentration region in a shallow region of the reverse side of the drift layer 1. Using dopants differently according to different purposes by taking advantage of these features facilitates the formation of the first n-type buffer layer 8 and the second n-type buffer layer 11 to a desired depth and with a desired impurity concentration.

Second Embodiment

Figure 25:
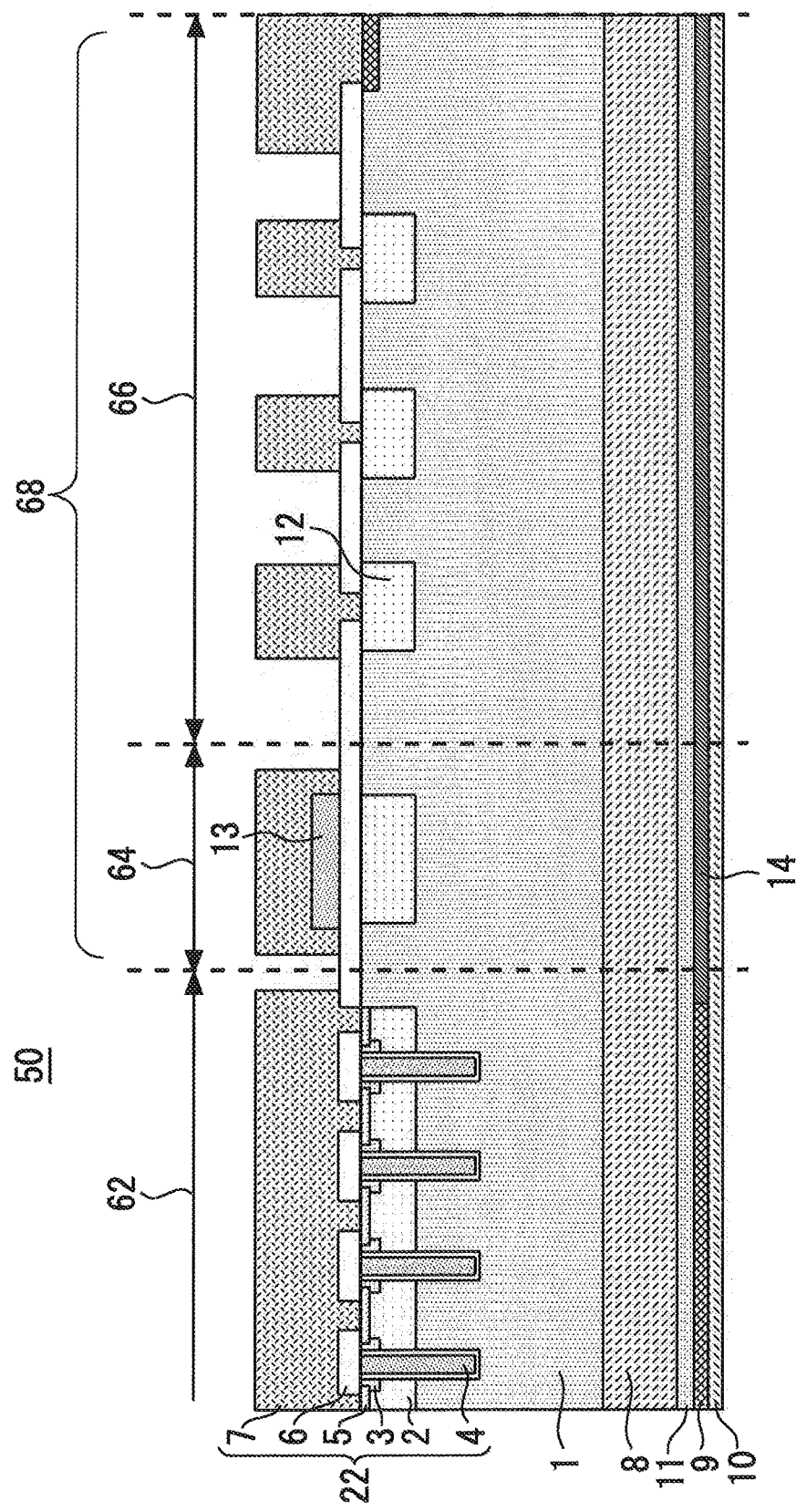
FIG. 25 is a diagram illustrating a semiconductor device according to a second embodiment of the present invention.

FIG. 25 is a diagram illustrating a semiconductor device 50 according to a second embodiment of the present invention. In the first embodiment, the collector layer 9 is formed over the entire reverse side of the drift layer 1. In contrast, in the second embodiment, a p-type collector layer 9 is formed directly below a cell part 62 and a p-type collector layer 14 which has a lower impurity concentration than the collector layer 9 is formed directly below a gate wiring part 64 and a withstand voltage holding part 66. Except this, the semiconductor device 50 according to the second embodiment has a structure similar to that of the semiconductor device 20 according to the first embodiment. Therefore, suppose the following description will focus on differences from the first embodiment. Identical or corresponding elements between the first embodiment and the second embodiment are assigned the same reference numerals and description thereof will be simplified or omitted.

As shown in FIG. 25, the semiconductor device 50 is provided with the cell part 62 and a peripheral portion 68 provided so as to surround the cell part 62 on the front surface of the drift layer 1. The peripheral portion 68 includes the gate wiring part 64 and the withstand voltage holding part 66. The gate wiring part 64 is provided next to the cell part 62 on the front surface of the drift layer 1. The gate wiring part 64 is provided with a gate wiring 13. The gate wiring 13 is connected to the trench gate 4 according to a publicly known wiring method whose details are not shown. The withstand voltage holding part 66 is provided further next to the gate wiring part 64. The withstand voltage holding part 66 is provided with a guard ring 12. Note that when the semiconductor device 50 is seen in a plan view, the cell part 62 is provided in the center of the semiconductor chip, the gate wiring part 64 is provided around the cell part 62 and the withstand voltage holding part 66 is provided further outside the gate wiring part 64.

The collector layer 9 is of a p-type and is provided on the reverse side of the second n-type buffer layer 11 in a region directly below the cell part 62. The collector layer 14 is of a p-type and is provided on the reverse side of the second n-type buffer layer 11 in a region directly below the gate wiring part 64 and in a region directly below the withstand voltage holding part 66. The impurity concentration of the collector layer 14 is lower than the impurity concentration of the collector layer 9.

In a situation in which the gate is given a voltage exceeding a threshold voltage and the IGBT is on, an electron current flows toward a collector region directly below the cell part 62. Therefore, since the collector region directly below the cell part 62 region performs an on-operation, an equivalent on-voltage is given regardless of the presence or absence of the collector layer 14 having a low impurity concentration provided directly below the withstand voltage holding part 66. However, in a test of turn-off cut-off resistance such as the reverse bias safe operation area (RBSOA), the IGBT temporarily starts a pnp operation when the gate voltage is cut at the time of turn-off. For this reason, by providing the low concentration collector layer 14 directly below the withstand voltage holding part 66, it is possible to suppress a hole current flowing from the collector layer 14 directly below the withstand voltage holding part 66 into the cell part 62. As a result, the turn-off cut-off resistance is improved.

Figure 26:
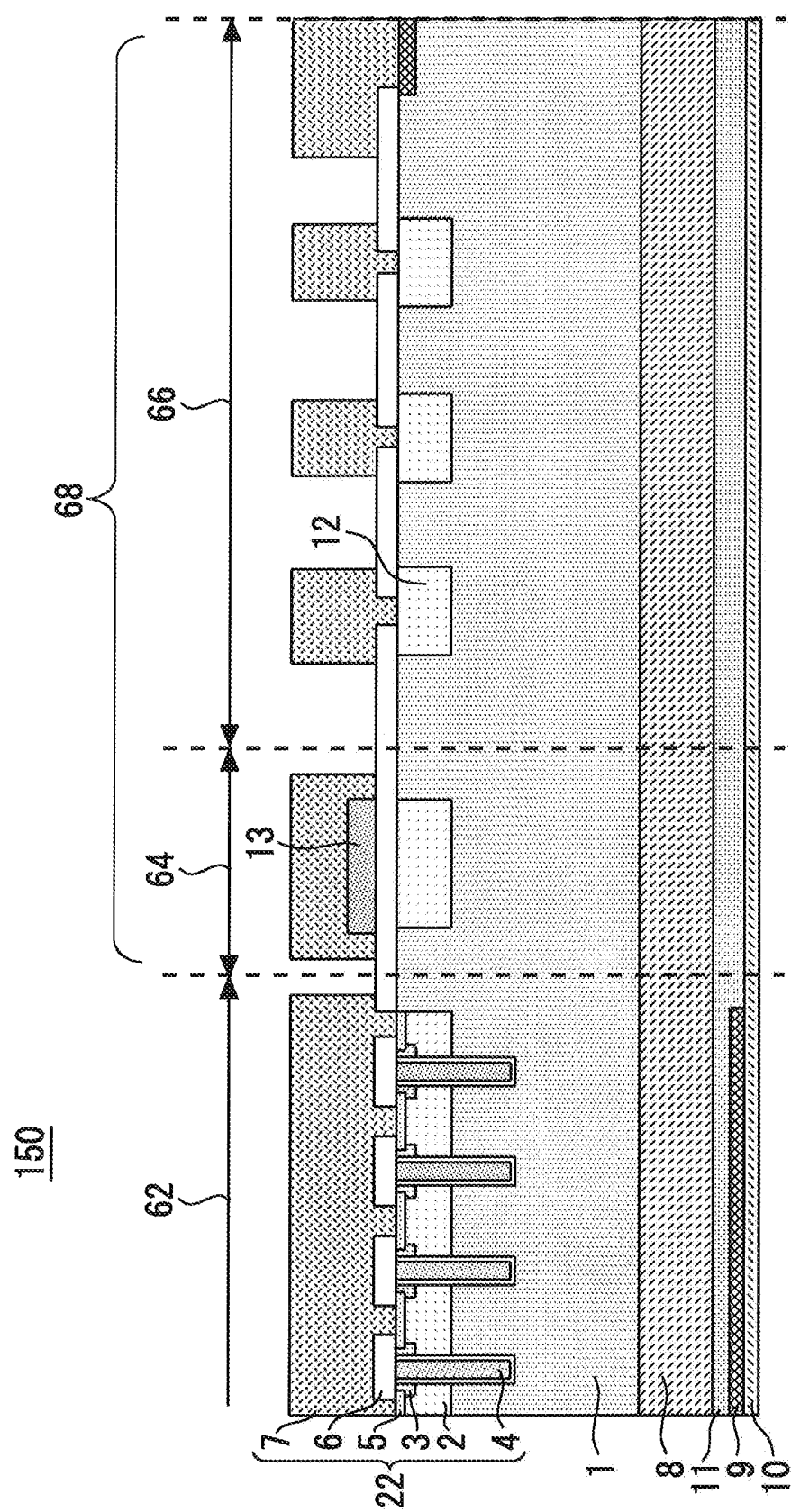
FIG. 26 is a diagram illustrating a semiconductor device according to a modification of the second embodiment of the present invention.

FIG. 26 is a diagram illustrating a semiconductor device 150 according to a modification of the second embodiment of the present invention. In the semiconductor device 150, the collector layer 9 is formed only in a region directly below the cell part 62. That is, the collector layer is not provided in regions directly below the gate wiring part 64 and the withstand voltage holding part 66, and the collector electrode 10 is formed on the reverse side of the second n-type buffer layer 11 in the regions directly below the gate wiring part 64 and the withstand voltage holding part 66.

Differences in effects between the semiconductor devices 50 and 150 will be described. The turn-off cut-off resistance can be improved more by not forming the collector layer 9 in the region directly below the peripheral portion 68 as in the case of the semiconductor device 150 than by reducing the impurity concentration of the collector layer 14 directly below the withstand voltage holding part 66. However, on the other hand, the semiconductor device 150 also has a disadvantage that the withstand voltage decreases when voltages in reverse directions are applied to the first and second n-type buffer layers 8 and 11, and the collector layer 9. To be more specific, when energy stored in an inductive load starts flowing into a freewheeling diode during a switching operation, a voltage on the order of several tens of volts may be instantaneously applied to the diode. In this case, a minus voltage is applied to the collector side of the IGBT connected in parallel to the freewheeling diode. For this reason, a withstand voltage of the pn junction on the reverse side may be needed. In order to obtain such a withstand voltage, in the semiconductor device 50, the collector layer 14 is formed which has an impurity concentration enough to hold a reverse withstand voltage directly below the withstand voltage holding part 66.

Note that the withstand voltage holding part 66 is wider in the plane direction of the semiconductor devices 50 and 150 than the gate wiring part 64. Improving the structure of the collector layer directly below the withstand voltage holding part 66 is more important to an improvement of RBSOA. Therefore, it is preferable to provide the collector layer 14 or provide none of the collector layers 9 and 14 in the region directly below at least the withstand voltage holding part 66. Both the gate wiring part 64 and the withstand voltage holding part 66 are ineffective regions where no transistor is formed, that is, regions where the collector layer on the reverse side is not essential. Therefore, the gate wiring part 64 and the withstand voltage holding part 66 can be collectively handled as the peripheral portion 68, and the collector layer 14 may be provided in the region directly below the peripheral portion 68 as in the case of the semiconductor device 50 or the collector layer may not be provided in the region directly below the peripheral portion 68 as in the case of the semiconductor device 150.

Note that when the semiconductor device 50 according to the second embodiment is manufactured, the boron implantation step in step S112 and the laser annealing step in step S114 in the manufacturing method of the first embodiment may be modified as an example. More specifically, the impurity concentration of the collector layer may be changed between the region directly below the cell part 62, the regions directly below the gate wiring part 64 and the withstand voltage holding part 66 using a lithography process technique.

Note that the collector layer 14 according to the second embodiment may be applicable to a so-called longitudinal IGBT and longitudinal MOSFET. It is also applicable to publicly known longitudinal IGBT and longitudinal MOSFET, and applicable to both a trench gate and a planar gate regardless of the presence or absence of the first n-type buffer layer 8 and the second n-type buffer layer 11 according to the first embodiment.

The features and advantages of the present invention may be summarized as follows. According to the first aspect of the present invention, an appropriate upper limit is defined for the impurity concentration of the first buffer layer so as to be able to reduce a maximum electric field in the semiconductor device, and it is thereby possible to maintain the SCSOA so as to have a preferable characteristic.

According to the second aspect of the present invention, an appropriate dopant is selected according to the necessary buffer layer structure, and it is thereby easier to accurately form the first and second buffer layers in the deep region and the shallow region on the drift layer reverse side respectively.

According to the third aspect of the present invention, it is possible to improve the RBSOA by preventing supplies of holes to the cell part from the outside of the cell part. Simultaneously, it is also possible to prevent deterioration of a reverse breakdown voltage by providing a collector layer having a low impurity concentration in a region directly below the gate wiring part.

Obviously many modifications and variations of the present invention are possible in the light of the above teachings. It is therefore to be understood that within the scope of the appended claims the invention may be practiced otherwise than as specifically described. The entire disclosure of Japanese Patent Application No. 2016-219845, filed on Nov. 10, 2016 including specification, claims, drawings and summary, on which the Convention priority of the present application is based, is incorporated herein by reference in its entirety.

The invention claimed is:

1. A semiconductor device comprising:
a drift layer formed of a first conductive type semiconductor material;
a MOSFET part provided on a front surface of the drift layer and comprising a second conductive type semiconductor layer that forms a pn junction with the drift layer;
a first buffer layer provided on a reverse side of the drift layer, having the first conductive type, having a higher impurity concentration than the drift layer and having a total amount of electrically active impurities per unit area of $1.0 \times 10^{12}$ cm$^{-2}$ or less; and
a second buffer layer provided on a reverse side of the first buffer layer, having the first conductive type and having a higher impurity concentration than the first buffer layer,
wherein
the second buffer layer includes impurities selected from the group of phosphor, arsenic and nitrogen, and a total amount of electrically active impurities per unit area of the second n-type buffer layer is set so as to fall within a range of $7 \times 10^{11}$ cm$^{-2}$ to $1.4 \times 10^{12}$ cm$^{-2}$.

2. The semiconductor device according to claim 1, wherein the total amount of electrically active impurities per unit area of the first buffer layer is $4.5 \times 10^{11}$ cm$^{-2}$ or more.

3. The semiconductor device according to claim 1, wherein the semiconductor material is silicon,
a dopant of the first buffer layer is protons, and
a dopant of the second buffer layer is phosphor or arsenic.

4. The semiconductor device according to claim 1, wherein the semiconductor material is silicon carbide,
a dopant of the first buffer layer is protons, and
a dopant of the second buffer layer is nitrogen.

5. The semiconductor device according to claim 1, further comprising a collector layer that is provided on a reverse side of the second buffer layer and has the second conductive type.

6. The semiconductor device according to claim 5, further comprising a peripheral portion provided around the MOSFET part on the front surface of the drift layer,
wherein the collector layer is provided in a region directly below the MOSFET part and in a region directly below the peripheral portion on the reverse side of the second buffer layer, and has the second conductive type, and
an impurity concentration of the collector layer in the region directly below the peripheral portion is lower than an impurity concentration of the collector layer in the region directly below the MOSFET part.

7. The semiconductor device according to claim 5, further comprising a peripheral portion provided around the MOSFET part on the front surface of the drift layer,
wherein the collector layer has the second conductive type, is provided in a region directly below the MOSFET part on the reverse side of the second buffer layer and is not provided in a region directly below the peripheral portion on the reverse side of the second buffer layer.

8. A semiconductor device comprising:
a drift layer formed of a first conductive type semiconductor material;
a cell part provided on a front surface of the drift layer;
a peripheral portion provided around the cell part on the front surface of the drift layer;
a first buffer layer that is provided on a reverse side of the drift layer and has the first conductive type, the first buffer layer extending beneath the cell part and the peripheral portion;
a second buffer layer that is provided on the reverse side of the drift layer and has the first conductive type, the second buffer layer extending beneath the cell part and the peripheral portion, and the second buffer layer having a higher impurity concentration than the first buffer layer; and
a collector layer that is provided so as to extend over a region directly below the cell part and a region directly below the peripheral portion on a reverse side of the second buffer layer, and has a second conductive type, whose impurity concentration in a region directly below the peripheral portion is lower than an impurity concentration in a region directly below the cell part, wherein the second buffer layer includes impurities selected from the group of phosphor, arsenic and nitrogen, and a total amount of electrically active impurities per unit area of the second n-type buffer layer is set so as to fall within a range of $7 \times 10^{11}$ cm$^{-2}$ to $1.4 \times 10^{12}$ cm$^{-2}$.

9. The semiconductor device according to claim 8, wherein the peripheral portion comprises a gate wiring part provided next to the cell part on the front surface of the drift layer and a withstand voltage holding part provided further next to the gate wiring part, and the collector layer is provided so as to extend over a region directly below the gate wiring part and a region directly below the withstand voltage holding part on the reverse side of the buffer layer, whose impurity concentrations in a region directly below the gate wiring part and in a region directly below the withstand voltage holding part are lower than an impurity concentration in a region directly below the cell part.

* * * * *